(12) United States Patent
Shang et al.

(10) Patent No.: US 11,776,479 B2
(45) Date of Patent: Oct. 3, 2023

(54) DISPLAY SUBSTRATE AND DISPLAY DEVICE

(71) Applicants: CHENGDU BOE OPTOELECTRONICS TECHNOLOGY CO., LTD., Chengdu (CN); BOE TECHNOLOGY GROUP CO., LTD., Beijing (CN)

(72) Inventors: Tinghua Shang, Beijing (CN); Yang Zhou, Beijing (CN); Haigang Qing, Beijing (CN); Linhong Han, Beijing (CN); Ling Shi, Beijing (CN); Yao Huang, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/828,211

(22) Filed: May 31, 2022

(65) Prior Publication Data

US 2022/0293057 A1 Sep. 15, 2022

Related U.S. Application Data

(63) Continuation of application No. 17/272,777, filed as application No. PCT/CN2020/106413 on Jul. 31, 2020, now Pat. No. 11,423,840.

(30) Foreign Application Priority Data

Jul. 31, 2019 (WO) ................ PCT/CN2019/098708
Jul. 31, 2019 (WO) ................ PCT/CN2019/098731

(51) Int. Cl.
*G09G 3/3258* (2016.01)
*G09G 3/20* (2006.01)
(Continued)

(52) U.S. Cl.
CPC ......... *G09G 3/3258* (2013.01); *G09G 3/2003* (2013.01); *G09G 3/3266* (2013.01);
(Continued)

(58) Field of Classification Search
CPC .. G09G 3/3258; G09G 3/2003; G09G 3/3266; G09G 3/3291; H01L 27/3258; H01L 27/3276; H01L 51/5212
See application file for complete search history.

(56) References Cited

U.S. PATENT DOCUMENTS 7,355,342 B2  4/2008 Kayashi
7,420,212 B2  9/2008 Kim et al.
(Continued)

FOREIGN PATENT DOCUMENTS

CN  1622716 A  6/2005
CN  1832225 A  9/2006
(Continued)

OTHER PUBLICATIONS

First Australian Office Action from Australian Patent Application No. p112603AU dated Jul. 21, 2021.
(Continued)

*Primary Examiner* — Sardis F Azongha
(74) *Attorney, Agent, or Firm* — Dilworth & Barrese, LLP.; Michael J. Musella, Esq.

(57) ABSTRACT

A display substrate and a display device are provided. A sub-pixel in the display substrate includes a light emitting element and a pixel circuit; the light emitting element includes a first electrode, a light emitting layer and a second electrode; the pixel circuit includes a driving transistor and a storage capacitor. The sub-pixel includes a first color sub-pixel pair which includes a first pixel block and a second pixel block. In a same first color sub-pixel pair, an overlapping situation, of orthographic projections of the second
(Continued)

electrode of one first pixel block and a gate electrode of the driving transistor of the one first pixel block on the base substrate, is the same as an overlapping situation, of orthographic projections of the second electrode of one second pixel block and a gate electrode of the driving transistor of the one second pixel block on the base substrate.

20 Claims, 10 Drawing Sheets

(51) Int. Cl.
  *G09G 3/3266* (2016.01)
  *G09G 3/3291* (2016.01)
  *H01L 27/32* (2006.01)
  *H01L 51/52* (2006.01)
  *H10K 50/814* (2023.01)
  *H10K 59/124* (2023.01)
  *H10K 59/131* (2023.01)
  *H10K 59/35* (2023.01)
  *H10K 59/121* (2023.01)

(52) U.S. Cl.
  CPC ......... *G09G 3/3291* (2013.01); *H10K 50/814* (2023.02); *H10K 59/124* (2023.02); *H10K 59/1213* (2023.02); *H10K 59/131* (2023.02); *H10K 59/353* (2023.02); *G09G 2300/0426* (2013.01); *G09G 2300/0443* (2013.01)

(56) References Cited

U.S. PATENT DOCUMENTS

| | | | |
|---|---|---|---|
| 8,508,438 B2 | 8/2013 | Suh | |
| 8,952,374 B2 | 2/2015 | Jinta et al. | |
| 8,981,364 B2 | 3/2015 | Hong | |
| 9,262,961 B2 | 2/2016 | Shih et al. | |
| 9,508,285 B2 | 11/2016 | Matsueda et al. | |
| 9,847,486 B2 | 12/2017 | Park et al. | |
| 9,959,808 B2 | 5/2018 | Sun | |
| 10,038,048 B2 | 7/2018 | Park | |
| 10,217,802 B2 | 2/2019 | Hwang | |
| 10,304,918 B2 | 5/2019 | Lee et al. | |
| 10,304,920 B2 | 5/2019 | Choi et al. | |
| 10,403,701 B2 | 9/2019 | Koshihara et al. | |
| 10,431,152 B2 | 10/2019 | Kim | |
| 10,461,268 B2 | 10/2019 | Jiang et al. | |
| 10,541,294 B2 | 1/2020 | Hong et al. | |
| 10,553,145 B2 | 2/2020 | Shi | |
| 10,692,949 B2 | 6/2020 | Lee et al. | |
| 10,707,285 B2 | 7/2020 | Kwon et al. | |
| 10,790,343 B2 | 9/2020 | Chen et al. | |
| 10,811,489 B2 | 10/2020 | Hong et al. | |
| 10,854,683 B2 | 12/2020 | Lee | |
| 11,367,376 B2 | 6/2022 | Wu et al. | |
| 11,417,867 B2 | 8/2022 | Lim et al. | |
| 11,552,107 B2 | 1/2023 | Ikeda et al. | |
| 2004/0174375 A1 | 9/2004 | Credelle et al. | |
| 2005/0116232 A1 | 6/2005 | Kim et al. | |
| 2006/0202611 A1 | 9/2006 | Hayashi | |
| 2010/0096988 A1 | 4/2010 | Kitabayashi et al. | |
| 2014/0374703 A1 | 12/2014 | Jung | |
| 2016/0133679 A1 | 5/2016 | Jeon et al. | |
| 2016/0260792 A1 | 9/2016 | Kim et al. | |
| 2017/0125506 A1 | 5/2017 | Kim | |
| 2017/0169760 A1 | 6/2017 | Kim | |
| 2017/0373131 A1 | 12/2017 | Sato et al. | |
| 2018/0076270 A1 | 3/2018 | Kwon et al. | |
| 2018/0076272 A1 | 3/2018 | Koshihara et al. | |
| 2018/0076273 A1 | 3/2018 | Kim et al. | |
| 2018/0130401 A1 | 5/2018 | Xiang et al. | |
| 2019/0011830 A1 | 1/2019 | Ji et al. | |
| 2019/0140030 A1 | 5/2019 | Huangfu et al. | |
| 2020/0135085 A1 | 4/2020 | Tian | |
| 2020/0294446 A1 | 9/2020 | Long | |
| 2020/0343477 A1 | 10/2020 | Zeng et al. | |
| 2020/0402444 A1 | 12/2020 | Yang et al. | |
| 2021/0159284 A1 | 5/2021 | Huang et al. | |
| 2021/0183341 A1 | 6/2021 | Shi et al. | |
| 2021/0359249 A1 | 11/2021 | Zhang et al. | |
| 2021/0383761 A1 | 12/2021 | Kim | |
| 2021/0408203 A1 | 12/2021 | Shi et al. | |
| 2022/0020827 A1 | 1/2022 | Liu et al. | |

FOREIGN PATENT DOCUMENTS

| | | | |
|---|---|---|---|
| CN | 103715205 A | 12/2013 | |
| CN | 106298865 A | 11/2016 | |
| CN | 106298851 A | 1/2017 | |
| CN | 107452773 A | 12/2017 | |
| CN | 107808892 A | 3/2018 | |
| CN | 107819010 A | 3/2018 | |
| CN | 108074950 A | 5/2018 | |
| CN | 108417608 A | 8/2018 | |
| CN | 207781607 U | 8/2018 | |
| CN | 207781608 U | 8/2018 | |
| CN | 208172439 U | 11/2018 | |
| CN | 108933155 A | 12/2018 | |
| CN | 109427278 A | 3/2019 | |
| CN | 208753327 U | 4/2019 | |
| CN | 110010058 A | 7/2019 | |
| CN | 110034132 A | 7/2019 | |
| CN | 110061042 A | 7/2019 | |
| EP | 3407389 A1 | 11/2018 | |
| JP | 2010003880 A | 1/2010 | |
| JP | 2011-187431 A | 9/2011 | |
| JP | 2013187187 A | 9/2013 | |
| JP | 2014186258 A | 10/2014 | |
| JP | 2016009636 A | 1/2016 | |
| JP | 2017-167515 A | 9/2017 | |
| JP | 2018063427 A | 4/2018 | |
| JP | 2019-109504 A | 7/2019 | |
| KR | 1020160148686 A | 12/2016 | |
| KR | 20170070437 A | 6/2017 | |
| KR | 20170129339 A | 11/2017 | |
| KR | 20180128545 A | 12/2018 | |
| RU | 2721754 C1 | 5/2020 | |
| RU | 2727938 C1 | 7/2020 | |
| TW | 201135703 A | 10/2011 | |
| TW | 201503354 A | 1/2015 | |
| TW | 201740560 A | 11/2017 | |
| WO | 2019/073670 A1 | 4/2019 | |

OTHER PUBLICATIONS

Second Australian Office Action from Australian Patent Application No. p112603AU dated Jul. 21, 2021.
First Taiwanese Office Action from Taiwanese Patent Application No. 10920982030 dated Oct. 15, 2020.
First Taiwanese Office Action from Taiwanese Patent Application No. 10920760590 dated Aug. 12, 2020.
First Office Action issued by the USPTO in the corresponding U.S. Appl. No. 16/954,924 dated Mar. 23, 2022.
First Office Action issued by the Indian Patent Office in the corresponding application No. 201947051441dated Mar. 29, 2022.
First Office Action issued by the Indian Patent Office in the corresponding application No. 201947050354 dated Mar. 30, 2022.
Office Action from U.S. Appl. No. 16/771,454 dated Jun. 16, 2022.
Office Action from U.S. Appl. No. 16/954,924 dated Mar. 23, 2022.
Notice of Allowance from U.S. Appl. No. 17/156,802 dated Jun. 6, 2022.
Korean Office Action from Korean Patent Application No. 10-2020-7037682 dated Sep. 14, 2022.
Japanese Office Action from Japanese Patent Application No. 2019-569409 dated Apr. 10, 2023.
Japanese Office Action from Japanese Patnet Application No. 2019-569405 dated May 15, 2023.
Mexican Office Action from Application No. MX/A/2019/15388, dated May 2, 2023.

(56) References Cited

OTHER PUBLICATIONS

Office Action issued by the Korean Patent Office in the corresponding application No. 10-2020-7037682; The Office Action dated Jul. 25, 2023.

Office Action issued by the Japanese Patent Office in the corresponding application No. 2022-090879; The Office Action dated Aug. 7, 2023.

DISPLAY SUBSTRATE AND DISPLAY DEVICE

This application is a continuation application of U.S. Ser. No. 17/272,777 filed on Mar. 2, 2021 which is a U.S. National Phase Entry of International Application No. PCT/CN2020/106413 filed on Jul. 31, 2020, International Application No. PCT/CN2020/106413 claims priority of PCT international application No. PCT/CN2019/098708, filed on Jul. 31, 2019, and PCT international application No. PCT/CN2019/098731, filed on Jul. 31, 2019, and the entire contents of which are incorporated herein by reference.

TECHNICAL FIELD

At least one embodiment of the present disclosure relates to a display substrate and a display device.

BACKGROUND

With the development of organic light emitting diode display technology, such as active matrix organic light emitting diode (AMOLED) display technology, people have higher and higher requirements for display effect, and the design of the pixel circuit in display products is critical for the display characteristics of AMOLED products. At present, how to improve the display characteristics of organic light emitting display devices has become the focus of research and development of organic light emitting display devices.

SUMMARY

At least one embodiment of the present disclosure provides a display substrate and a display device.

At least one embodiment of the present disclosure provides a display substrate, including: a base substrate; and a plurality of sub-pixels on the base substrate. Each of the plurality of sub-pixels includes a light emitting element and a pixel circuit, the light emitting element includes a first electrode, a light emitting layer and a second electrode which are stacked in sequence, the second electrode is between the light emitting layer and the base substrate, the pixel circuit includes a driving transistor and a storage capacitor which are between the second electrode of the light emitting element and the base substrate, a gate electrode of the driving transistor is also used as an electrode of the storage capacitor. The plurality of sub-pixels include at least one first color sub-pixel pair and a plurality of sub-pixels of other colors, each first color sub-pixel pair includes a first pixel block and a second pixel block, a minimum distance between the first pixel block and the second pixel block in each first color sub-pixel pair is not greater than a minimum distance between two sub-pixels of a same color in the plurality of sub-pixels of other colors; in a same first color sub-pixel pair, an overlapping situation, of orthographic projections of the second electrode of the light emitting element of one first pixel block and the gate electrode of the driving transistor of the one first pixel block on the base substrate, is the same as an overlapping situation, of orthographic projections of the second electrode of the light emitting element of one second pixel block and the gate electrode of the driving transistor of the one second pixel block on the base substrate.

For example, in an embodiment of the present disclosure, the first pixel block and the second pixel block included in the same first color sub-pixel pair are arranged along a row direction, and the plurality of sub-pixels of other colors include second color sub-pixels and third color sub-pixels, and at least one kind of the second color sub-pixels and the third color sub-pixels is located in an adjacent row with the first color sub-pixel pair; the display substrate further includes a planarization layer, between the pixel circuit and the second electrode of the light emitting element, the planarization layer includes a plurality of via holes penetrating therethrough, and in each of the plurality of sub-pixels, the second electrode of the light emitting element is electrically connected with a corresponding pixel circuit through the via hole, the via holes corresponding to sub-pixels located in different rows of two adjacent rows of the plurality of sub-pixels are not on a straight line, and an orthographic projection of a via hole corresponding to one of two sub-pixels respectively located in the two adjacent rows on a straight line extending in a column direction is overlapped with an orthographic projection of an effective light emitting region of the other of the two sub-pixels on the straight line.

For example, in an embodiment of the present disclosure, the display substrate further includes data lines extending in a first direction, and power signal lines extending in the first direction. The plurality of sub-pixels of other colors include second color sub-pixels and third color sub-pixels, in a direction perpendicular to the base substrate, the second electrode of the light emitting element of at least one of the third color sub-pixels is overlapped with two data lines and two power signal lines.

For example, in an embodiment of the present disclosure, in the direction perpendicular to the base substrate, an effective light emitting region of the light emitting element of the at least one of the third color sub-pixels is overlapped with two data lines.

For example, in an embodiment of the present disclosure, the display substrate further includes data lines extending in a first direction and power signal lines extending in the first direction. The plurality of sub-pixels of other colors include second color sub-pixels and third color sub-pixels, in a direction perpendicular to the base substrate, the second electrode of the light emitting element of at least one of the second color sub-pixels is overlapped with two data lines.

For example, in an embodiment of the present disclosure, the plurality of sub-pixels include a plurality first color sub-pixel pairs arranged in a second direction, the plurality of first color sub-pixel pairs include first pixel blocks and second pixel blocks alternately arranged in the second direction, two distances between an effective light emitting region of one first pixel block and effective light emitting regions of two second pixel blocks located on both sides of the effective light emitting region of the one first pixel block in the second direction are different; and the display substrate further includes a data line extending in a first direction, an included angle between the second direction and the first direction is in a range from 80 degrees to 100 degrees.

For example, in an embodiment of the present disclosure, the plurality of sub-pixels of other colors include second color sub-pixels and third color sub-pixels, pixel circuits of the plurality of sub-pixels include pixel circuit rows arranged in a column direction, each pixel circuit row includes pixel circuits arranged in a row direction, and centers of effective light emitting regions of some second color sub-pixels and some third color sub-pixels connected with pixel circuits in a same pixel circuit row are not in a straight line.

For example, in an embodiment of the present disclosure, the pixel circuit further includes a threshold compensation transistor, a first electrode of the threshold compensation transistor is electrically connected with a first electrode of the driving transistor, and a second electrode of the threshold compensation transistor is electrically connected with a gate electrode of the driving transistor, the threshold compensation transistor includes a first gate electrode and a second gate electrode, the second electrode of the light emitting element of the first pixel block shields one of the first gate and the second gate.

For example, in an embodiment of the present disclosure, the plurality of sub-pixels of other colors include second color sub-pixels and third color sub-pixels, the second electrode of the light emitting element of each of the third color sub-pixels includes a main body electrode and a connecting electrode, the connecting electrode is configured to electrically connected with the pixel circuit, in a direction perpendicular to the base substrate, an effective light emitting region of the third color sub-pixel is overlapped with the main body electrode, and the main body electrode of the third color sub-pixel is overlapped with at least one of the first gate and the second gate.

For example, in an embodiment of the present disclosure, the second electrode of the light emitting element of a sub-pixel of at least one color includes a main body electrode and a connecting electrode, the connecting electrode is configured to electrically connected with the pixel circuit, in the direction perpendicular to the base substrate, an effective light emitting region of the sub-pixel of at least one color is overlapped with the main body electrode; the second electrode of the light emitting element of the sub-pixel of at least one color further includes an auxiliary electrode, the auxiliary electrode covers a part of an active layer between orthographic projections of the first gate electrode and the second gate electrode on the active layer.

For example, in an embodiment of the present disclosure, the pixel circuit further includes a threshold compensation transistor, a first light emitting control transistor, a first connecting portion and a second connecting portion which are between the second electrode of the light emitting element and the base substrate, a first electrode of the threshold compensation transistor is electrically connected with a first electrode of the driving transistor, and a second electrode of the threshold compensation transistor is electrically connected with a gate electrode of the driving transistor through the first connecting portion, a first electrode of the first light emitting control transistor is electrically connected with the first electrode of the driving transistor, and a second electrode of the first light emitting control transistor is electrically connected with the second electrode of the light emitting element through the second connecting portion, pixel circuits of the plurality of sub-pixels include pixel circuit rows arranged in a column direction, each pixel circuit row includes pixel circuits arranged in a row direction, two adjacent second connecting portions in a same pixel circuit row have different shapes and sizes.

For example, in an embodiment of the present disclosure, the display substrate further includes a light emitting control signal line, extending in the row direction and arranged in the same layer as the gate electrode of the driving transistor. In a direction perpendicular to the base substrate, the second connecting portion is overlapped with the light emitting control signal line and is not overlapped with the gate electrode of the driving transistor.

For example, in an embodiment of the present disclosure, in the first color sub-pixel pair, the second electrode of the light emitting element of each sub-pixel includes a main body electrode and a connecting electrode, the connecting electrode is configured to electrically connected with the pixel circuit, in a direction perpendicular to the base substrate, an effective light emitting region of the first pixel block is overlapped with the main body electrode, and an effective light emitting region of the second pixel block is overlapped with the main body electrode; a part of the second electrode of the light emitting element of the first pixel block except the main body electrode and a part of the second electrode of the light emitting element of the second pixel block except the main body electrode have different shapes and sizes.

For example, in an embodiment of the present disclosure, parts, of second electrodes of the light emitting elements of the first pixel block and the second pixel block, except main body electrodes and connecting electrodes are different in shape and size.

At least one embodiment of the present disclosure provides a display substrate, including: a base substrate; and a plurality of sub-pixels on the base substrate. Each of the plurality of sub-pixels includes a light emitting element and a pixel circuit, the light emitting element includes a first electrode, a light emitting layer and a second electrode which are stacked in sequence, the second electrode is between the light emitting layer and the base substrate, the pixel circuit includes a first connecting portion, a driving transistor and a threshold compensation transistor which are between the second electrode and the base substrate, the first connecting portion extends in a first direction, a first electrode of the threshold compensation transistor is electrically connected with a first electrode of the driving transistor, and a second electrode of the threshold compensation transistor is electrically connected with a gate electrode of the driving transistor through the first connecting portion, the plurality of sub-pixels include at least one first color sub-pixel pair and a plurality of sub-pixels of other colors, each first color sub-pixel pair includes a first pixel block and a second pixel block arranged in a second direction, a minimum distance between the first pixel block and the second pixel block in each first color sub-pixel pair is not greater than a minimum distance between two sub-pixels of a same color in the plurality of sub-pixels of other colors, and an included angle between the second direction and the first direction is in a range from 80 degrees to 100 degrees; and in the first pixel block, an overlapping area between an orthographic projection of the second electrode of the light emitting element on the base substrate and an orthographic projection of the first connecting portion on the base substrate is a first overlapping area; in the second pixel block, an overlapping area between an orthographic projection of the second electrode of the light emitting element on the base substrate and an orthographic projection of the first connecting portion on the base substrate is a second overlapping area; and a ratio of the first overlapping area to the second overlapping area is in a range from 0.8 to 1.2.

For example, in an embodiment of the present disclosure, in the first pixel block, the second electrode of the light emitting element covers 60%-90% of an area of the first connecting portion; and in the second pixel block, the second electrode of the light emitting element covers 60%-90% of an area of the first connecting portion.

For example, in an embodiment of the present disclosure, the first pixel block includes a first effective light emitting region, and the second pixel block includes a second effective light emitting region; in the first pixel block, a minimum distance between an orthographic projection of the first connecting portion on a straight line extending in the second direction and an orthographic projection of the first effective light emitting region on the straight line is a first distance, or the orthographic projection of the first connecting portion on the straight line extending in the second direction is overlapped with the orthographic projection of the first effective light emitting region on the straight line; in the second pixel block, a minimum distance between an orthographic projection of the first connecting portion on the straight line and an orthographic projection of the second effective light emitting region on the straight line is a second distance, and the first distance is less than the second distance; in the first pixel block, a gate electrode of the threshold compensation transistor is located at a side of the first connecting portion away from the first effective light emitting region; and in the second pixel block, a gate electrode of the threshold compensation transistor is located at a side of the first connecting portion close to the second effective light emitting region.

For example, in an embodiment of the present disclosure, the second electrode of the light emitting element of each of the plurality of sub-pixels includes a main body electrode and a connecting electrode; in the first pixel block, a shape of the main body electrode is approximately the same as a shape of the first effective light emitting region, and an orthographic projection of the first effective light emitting region on the base substrate is within an orthographic projection of the main body electrode on the base substrate, and the first effective light emitting region is overlapped with the first connecting portion; in the second pixel block, a shape of the main body electrode is approximately the same as a shape of the second effective light emitting region, an orthographic projection of the second effective light emitting region on the base substrate is within an orthographic projection of the main body electrode on the base substrate, and the second effective light emitting region is not overlapped with the first connecting portion.

For example, in an embodiment of the present disclosure, in the first color sub-pixel pair, the second electrode of the light emitting element further includes an auxiliary electrode connecting the main body electrode with the connecting electrode, and the connecting electrode extends in the first direction, in the first pixel block, the auxiliary electrode is located at a side of the main body electrode away from the second effective light emitting region, and in the second pixel block, the auxiliary electrode is located at a side of the main body electrode away from the first effective light emitting region.

At least one embodiment of the present disclosure provides a display device, including the display substrate as mentioned above.

BRIEF DESCRIPTION OF THE DRAWINGS

In order to clearly illustrate the technical solutions of the embodiments of the disclosure, the drawings of the embodiments will be briefly described in the following; it is obvious that the described drawings are only related to some embodiments of the disclosure and thus are not limitative to the disclosure.

DETAILED DESCRIPTION

Figure 1:
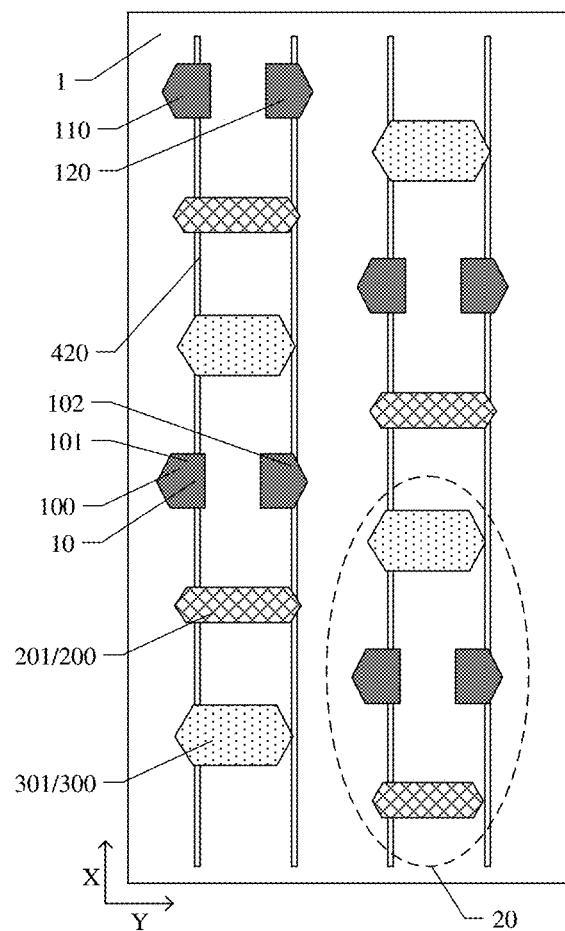
FIG. 1 is a schematic diagram of a partial planar structure of a display substrate according to an embodiment of the present disclosure.

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present disclosure, are not intended to indicate any sequence, amount or importance, but distinguish various components. Also, the terms "include," "including," "comprise," "comprising," etc., are intended to specify that the elements or the objects stated before these terms encompass the elements or the objects and equivalents thereof listed after these terms, but do not preclude the other elements or objects.

The features such as "parallel," "vertical," and "the same," used in the embodiments of the present disclosure all include the features of "parallel," "vertical," and "same," in strict sense, as well as the situations which contain a certain error, such as "approximately parallel," "approximately vertical," and "approximately the same." Taking into account the measurement and the errors related to the measurement of specific quantities (that is, the limitations of the measurement system), they are within an acceptable deviation range for the specific quantities determined by a person of ordinary skill in the art. The "center" in the embodiments of the present disclosure can include a position strictly located at the geometric center and a position approximately located in a small region around the geometric center. For example, "approximately" can be expressed as within one or more standard deviations, or within a 10% or 5% deviation of the stated quantities.

In research, an inventor of the present application has found that in the GGRB pixel arrangement structure, each pixel includes a red sub-pixel, a blue sub-pixel and a green sub-pixel pair, each sub-pixel includes a light emitting element and a pixel circuit for driving the light emitting element to emit light, and in the case where the loads of the gate nodes of the driving transistors included in pixel circuits of the two green sub-pixels which are included in the same green sub-pixel pair are different, the brightness of the two green sub-pixels included in the same green sub-pixel pair will be different when emitting light.

The embodiments of the present disclosure provide a display substrate and a display device. The display substrate includes a base substrate and a plurality of sub-pixels located on the base substrate. Each sub-pixel includes a light emitting element and a pixel circuit, the light emitting element includes a first electrode, a light emitting layer and a second electrode which are stacked in sequence; the second electrode is located between the light emitting layer and the base substrate; the pixel circuit includes a first connecting portion, a driving transistor and a threshold compensation transistor which are between the second electrode and the base substrate; the first connecting portion extends in a first direction, a first electrode of the threshold compensation transistor is electrically connected with a first electrode of the driving transistor, and a second electrode of the threshold compensation transistor is electrically connected with a gate electrode of the driving transistor through the first connecting portion. The plurality of sub-pixels include at least one first color sub-pixel pair and a plurality of sub-pixels of other colors, each first color sub-pixel pair includes a first pixel block and a second pixel block arranged in a second direction, a minimum distance between the first pixel block and the second pixel block in each first color sub-pixel pair is not greater than a minimum distance between two sub-pixels of the same color in the plurality of sub-pixels of other colors, and an included angle between the second direction and the first direction is in the range from 80 degrees to 100 degrees. The first pixel block includes a first effective light emitting region, and the second pixel block includes a second effective light emitting region; in the first pixel block, a minimum distance between an orthographic projection of the first connecting portion on a straight line extending in the second direction and an orthographic projection of the first effective light emitting region on the straight line is a first distance, or the orthographic projection of the first connecting portion on the straight line extending in the second direction is overlapped with the orthographic projection of the first effective light emitting region on the straight line; in the second pixel block, a minimum distance between an orthographic projection of the first connecting portion on the straight line and an orthographic projection of the second effective light emitting region on the straight line is a second distance, and the first distance is less than the second distance. In the first pixel block, an overlapping area between an orthographic projection of the second electrode on the base substrate and an orthographic projection of the first connecting portion on the base substrate is a first overlapping area; in the second pixel block, an overlapping area between an orthographic projection of the second electrode on the base substrate and an orthographic projection of the first connecting portion on the base substrate is a second overlapping area; and a ratio of the first overlapping area to the second overlapping area is in a range from 0.8 to 1.2. In the embodiments of the present disclosure, in the two first color sub-pixels included in the first color sub-pixel pair, the ratio between the overlapping areas of the second electrodes of the two light emitting elements with the corresponding two first connecting portions is in the range from 0.8 to 1.2, which can reduce the load difference of the gate nodes of the driving transistors in the two first color sub-pixels, thereby reducing the brightness difference between the two first color sub-pixels and improving the display characteristics of the display substrate.

The embodiments of the present disclosure further provide a display substrate, the display substrate includes a base substrate and a plurality of sub-pixels on the base substrate. Each of the plurality of sub-pixels includes a light emitting element and a pixel circuit, the light emitting element includes a first electrode, a light emitting layer and a second electrode which are stacked in sequence, the second electrode is between the light emitting layer and the base substrate, the pixel circuit includes a driving transistor and a storage capacitor which are between the second electrode of the light emitting element and the base substrate, a gate electrode of the driving transistor is also used as an electrode of the storage capacitor. The plurality of sub-pixels include at least one first color sub-pixel pair and a plurality of sub-pixels of other colors, each first color sub-pixel pair includes a first pixel block and a second pixel block, a minimum distance between the first pixel block and the second pixel block in each first color sub-pixel pair is not greater than a minimum distance between two sub-pixels of a same color in the plurality of sub-pixels of other colors; in a same first color sub-pixel pair, an overlapping situation, of orthographic projections of the second electrode of the light emitting element of one first pixel block and the gate electrode of the driving transistor of the one first pixel block on the base substrate, is the same as an overlapping situation, of orthographic projections of the second electrode of the light emitting element of one second pixel block and the gate electrode of the driving transistor of the one second pixel block on the base substrate, gate nodes of the driving transistors in two first color sub-pixels can have balanced coverage, which is beneficial to balancing the electrical environment and luminous effect of the two first color sub-pixels.

Hereinafter, the display substrate and the display device provided by the embodiments of the present disclosure will be described with reference to the accompanying drawings.

FIG. 1 is a schematic diagram of a partial planar structure of a display substrate according to an embodiment of the present disclosure. As shown in FIG. 1, the display substrate includes a base substrate 1 and a plurality of sub-pixels 10 located on the base substrate 1. For example, as shown in FIG. 1, the plurality of sub-pixels 10 are arranged as a plurality of repeating units 20. Each repeating unit 20 includes one second color sub-pixel 200, one first color sub-pixel pair 100 and one third color sub-pixel 300 arranged in a first direction (X direction shown in the figure), and two first color sub-pixels 110 and 120 included in the first color sub-pixel pair 100 are arranged in a second direction (Y direction shown in the figure, which is different from the first direction). A plurality of repeating units 20 are arranged in the first direction to form a plurality of repeating unit groups, and the plurality of repeating unit groups are arranged in the second direction, and adjacent repeating unit groups among the plurality of repeating unit groups are shifted from each other in the first direction, that is, adjacent repeating unit groups have a certain offset along the first direction. Therefore, sub-pixels of the same color in adjacent repeating unit groups are not aligned in the second direction. Pixels in odd column repeating unit groups are arranged in the same way, and pixels in even column repeating unit groups are arranged in the same way.

For example, the offset of adjacent repeating unit groups in the first direction is approximately half of the size of the repeating unit 20 in the first direction. For example, the size of the repeating unit 20 in the first direction is the pitch of the repeating unit 20 in the first direction. Here, the "pitch" refers to a distance between centers of the effective light emitting regions of two second color sub-pixels 200 respectively in two adjacent repeating units 20 in the first direction, and here, the center of the effective light emitting region refers to the geometric center of the planar shape of the effective light emitting region.

For example, the second direction and the first direction described above are two directions in the same plane, and the included angle between the two directions is in the range from 80 degrees to 100 degrees. For example, the plane is a plane in which the pixels are arranged. The repeating unit here only refers to the repetition of sub-pixels, and other structures in the repeating unit may be different or the same. In addition, the "repetition" means that the approximate position, shape and size are almost the same. In some cases, for the needs of wiring or opening, the shapes thereof may be slightly different, for example, openings are located at different positions.

For example, as shown in FIG. 1, the shape of the effective light emitting region 201 of the second color sub-pixel 200 is a long strip extending in the second direction. For example, the shape of the effective light emitting region 301 of the third color sub-pixel 300 is a long strip extending in the second direction. For example, the display substrate further includes data lines 420 located on the base substrate 10, and the data lines 420 extend in the first direction. Thus, the included angle between the extending direction of the effective light emitting region of the second color sub-pixel and the extending direction of the data line is in the range from 80 degrees to 100 degrees. In the case where the included angle between the extending direction of openings of a fine metal mask (FMM) used for vapor deposition of sub-pixels of respective colors and the extending direction of the data line is in the range from 80 degrees to 100 degrees, such as 90 degrees, the extending direction of the effective light emitting region of the second color sub-pixel is the same as the extending direction of the opening of the FMM.

For example, as shown in FIG. 1, the shapes of the effective light emitting region 201 of the second color sub-pixel 200 and the effective light emitting region 301 of the third color sub-pixel 300 include hexagons or ovals. In addition, although the shapes of the second color sub-pixel and the third color sub-pixel in the figure include strict corners formed by two line segments, in some embodiments, the shapes of the effective light emitting regions of the second color sub-pixel and the third color sub-pixel can both be shapes with rounded corners, such as ovals. That is, on the basis of the above hexagonal shape, the corners of the effective light emitting regions of the second color sub-pixel and the third color sub-pixel are rounded. For example, when an opening of the pixel defining layer is formed, the part at the corner of the opening will be formed as a shape with rounded corners, so that the shape of the effective light emitting region being formed is a shape with rounded corners. Hexagons in the embodiments of the present disclosure can include standard hexagons or approximate hexagons, such as hexagons with rounded corners and the like that have a roughly hexagonal shape with a hexagonal outline.

For example, the embodiment of the present disclosure illustratively shows that the first color sub-pixel pair 100 is a green sub-pixel pair, the second color sub-pixel 200 is a red sub-pixel, and the third color sub-pixel 300 is a blue sub-pixel. But not limited to this case, the names of respective color sub-pixels can be interchanged. In the embodiment of the present disclosure, a sub-pixel pair including two sub-pixels of the same color is a green sub-pixel pair; in the extending direction of the data line, the width of the effective light emitting region of the red sub-pixel is less than the width of the effective light emitting region of the blue sub-pixel; and the length of the effective light emitting region of the red sub-pixel is greater than the length of the effective light emitting region of the blue sub-pixel.

Figure 2:
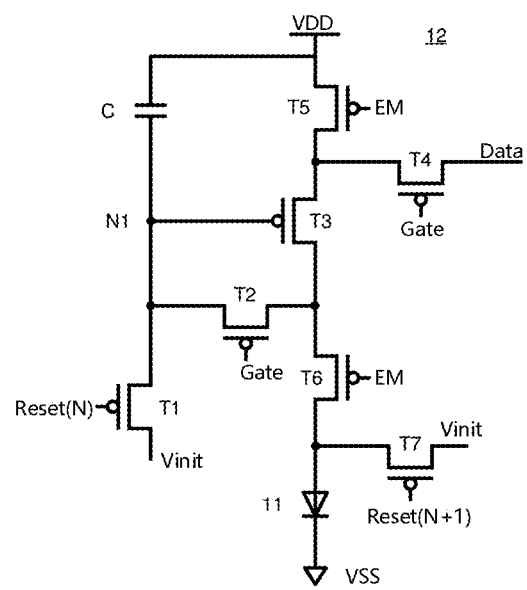
FIG. 2 is an equivalent diagram of a pixel circuit of each sub-pixel shown in FIG. 1.

For example, FIG. 2 is an equivalent diagram of the pixel circuit of each sub-pixel shown in FIG. 1. As shown in FIG. 2, each sub-pixel 10 includes a light emitting element 11 and a pixel circuit 12 for driving the light emitting element 11 to emit light, the light emitting element 11 includes a first electrode, a light emitting layer and a second electrode that are stacked in sequence, and the second electrode is located between the light emitting layer and the base substrate. For example, FIG. 5E illustratively shows that the light emitting element includes a first electrode 310, a light emitting layer 330 and a second electrode 320, and the second electrode 320 is located between the light emitting layer 330 and the base substrate 1. For example, the display substrate further includes a reset power signal line, a scan signal line, a power signal line, a reset control signal line and a light emitting control signal line that are located on the base substrate 10. For example, in the embodiments of the present disclosure, the names of the first electrode and the second electrode can be interchanged.

For example, as shown in FIG. 2, each pixel circuit 12 includes a data writing transistor T4, a driving transistor T3, a threshold compensation transistor T2, and a first reset transistor T7. The first electrode of the threshold compensation transistor T2 is connected with the first electrode of the driving transistor T3, the second electrode of the threshold compensation transistor T2 is connected with the gate electrode of the driving transistor T3, the first electrode of the first reset transistor T7 is connected with the reset power signal line to receive a reset signal Vinit, the second electrode of the first reset transistor T7 is connected with the light emitting element, and the first electrode of the data writing transistor T4 is connected with the second electrode of the driving transistor T3. For example, as shown in FIG. 2, the pixel circuit of each sub-pixel further includes a storage capacitor C, a first light emitting control transistor T6, a second light emitting control transistor T5 and a second reset transistor T1. The gate electrode of the data writing transistor T4 is electrically connected with the scan signal line to receive a scan signal Gate; the first electrode of the storage capacitor C is electrically connected with the power signal line, and the second electrode of the storage capacitor C is electrically connected with the gate electrode of the driving transistor T3; the gate electrode of the threshold compensation transistor T2 is electrically connected with the scan signal line to receive a compensation control signal; the gate electrode of the first reset transistor T7 is electrically connected with the reset control signal line to receive a reset control signal Reset(N+1); the first electrode of the second reset transistor T1 is electrically connected with the reset power signal line to receive the reset signal Vinit, the second electrode of the second reset transistor T1 is electrically connected with the gate electrode of the driving transistor T3, and the gate electrode of the second reset transistor T1 is electrically connected with the reset control signal line to receive a reset control signal Reset(N); the gate electrode of the first light emitting control transistor T6 is electrically connected with the light emitting control signal line to receive a light emitting control signal EM; the first electrode of the second light emitting control transistor T5 is electrically connected with the power signal line to receive a first power signal VDD, the second electrode of the second light emitting control transistor T5 is electrically connected with the second electrode of the driving transistor T3, the gate electrode of the second light emitting control transistor T5 is electrically connected with the light emitting control signal line to receive the light emitting control signal EM, and the first electrode of the light emitting element 11 is connected with a voltage terminal VSS. The power signal line described above refers to a signal line outputting the voltage signal VDD, and can be connected with a voltage source to output a constant voltage signal, such as a positive voltage signal.

For example, the scan signal and the compensation control signal can be the same, that is, the gate electrode of the data writing transistor T3 and the gate electrode of the threshold compensation transistor T2 can be electrically connected with the same signal line to receive the same signal, thus reducing the number of signal lines. For example, the gate electrode of the data writing transistor T3 and the gate electrode of the threshold compensation transistor T2 can also be electrically connected with different signal lines, respectively, that is, the gate electrode of data writing transistor T3 is electrically connected with a first scan signal line, the gate electrode of the threshold compensation transistor T2 is electrically connected with a second scan signal line, and the signals transmitted by the first scan signal line and the second scan signal line can be the same or different. Thus, the data writing transistor T3 and threshold compensation transistor T2 can be separately controlled, thereby increasing the flexibility of controlling the pixel circuit.

For example, the light emitting control signals input to the first light emitting control transistor T6 and the second light emitting control transistor T5 can be the same, that is, the gate electrode of the first light emitting control transistor T6 and the gate electrode of the second light emitting control transistor T5 can be electrically connected with the same signal line to receive the same signal, thereby reducing the number of signal lines. For example, the gate electrode of the first light emitting control transistor T6 and the gate electrode of the second light emitting control transistor T5 can also be electrically connected with different light emitting control signal lines, and the signals transmitted by the different light emitting control signal lines can be the same or different.

For example, the reset control signals input to the first reset transistor T7 and the second reset transistor T1 can be the same, that is, the gate electrode of the first reset transistor T7 and the gate electrode of the second reset transistor T1 can be electrically connected with the same signal line to receive the same signal, thereby reducing the number of signal lines. For example, the gate electrode of the first reset transistor T7 and the gate electrode of the second reset transistor T1 can also be electrically connected with different reset control signal lines, and the signals on the different reset control signal lines can be the same or different.

For example, as shown in FIG. 2, when the display substrate works, in the first stage of displaying, the second reset transistor T1 is turned on to initialize the voltage of the node N1; in the second stage of displaying, the signal Data is stored at the node N1 through data writing transistor T4, the driving transistor T3 and the threshold compensation transistor T2; in the third light emitting stage, the second light emitting control transistor T5, the driving transistor T3 and the first light emitting control transistor T6 are all turned on, and the light emitting element is forwardly conducted to emit light.

It should be noted that, in the embodiments of the present disclosure, the pixel circuit of each sub-pixel can be of the 7T1C structure (i.e., seven transistors and one capacitor) shown in FIG. 2, and can also be of a structure including other numbers of transistors, such as 7T2C structure, 6T1C structure, 6T2C structure or 9T2C structure, without being limited in the embodiments of the present disclosure. What is needed is that the data writing transistors T4 of two pixel circuits are connected, and the nodes N4 of the two pixel circuits are connected to jointly drive the same light emitting unit to emit light.

Figure 3A:
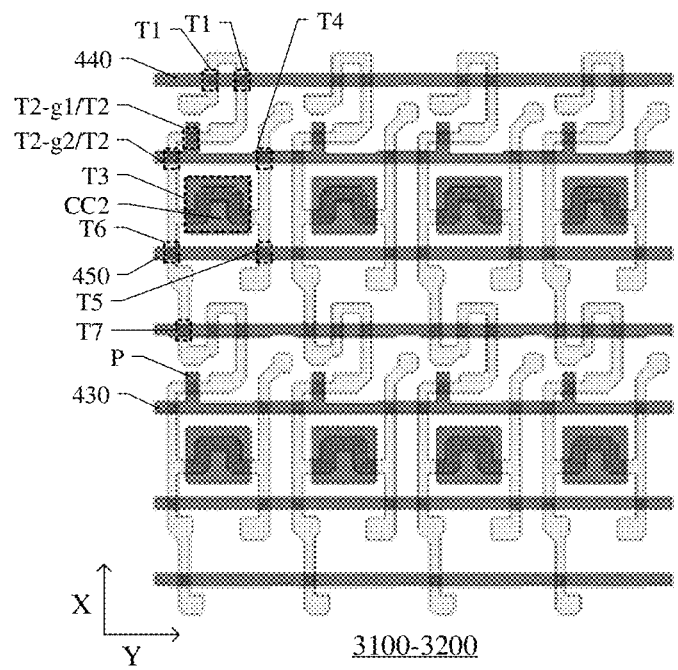
FIG. 3A is a schematic diagram of a partial planar structure of a laminated structure of an active semiconductor layer and a first conductive layer in some pixel circuits according to an embodiment of the present disclosure.

FIG. 3A is a schematic diagram of a partial planar structure of a laminated structure of an active semiconductor layer and a first conductive layer in some pixel circuits according to an embodiment of the present disclosure. As shown in FIG. 3A, the active semiconductor layer 3100 can be formed by patterning a semiconductor material. The active semiconductor layer 3100 can be used to fabricate the active layers of the second reset transistor T1, the threshold compensation transistor T2, the driving transistor T3, the data writing transistor T4, the second light emitting control transistor T5, the first light emitting control transistor T6 and the first reset transistor T7. The active semiconductor layer 3100 includes active layer patterns (channel regions) and doped region patterns (source-drain doped regions) of the transistors of each sub-pixel, and the active layer pattern and doped region pattern of each transistor in the same pixel circuit are integrally provided.

It should be noted that the active layer may can include a low-temperature poly-silicon layer which is integrally formed, and the source region and the drain region can be conductive by means of doping or the like to realize the electrical connection of each structure. That is, the active semiconductor layer of each transistor in each sub-pixel is an integral pattern formed by p-silicon, and each transistor in the same pixel circuit includes a doped region pattern (i.e., a source region and a drain region) and an active layer pattern, and the active layers of different transistors are separated by doped structures.

For example, the active semiconductor layer 3100 can be made of amorphous silicon, poly-silicon, an oxide semiconductor material, etc. It should be noted that the source region and the drain region can be regions doped with N-type impurities or P-type impurities.

For example, the display substrate includes a gate insulating layer located at one side of the active semiconductor layer away from the base substrate, and the gate insulating layer is configured for insulating the active semiconductor layer 3100 from a first conductive layer 3200 (i.e., a gate metal layer) formed subsequently. For example, the display substrate includes the first conductive layer 3200, the first conductive layer 3200 is disposed on the gate insulating layer so as to be insulated from the active semiconductor layer 3100. The first conductive layer 3200 can include a second electrode CC2 of the capacitor C, a plurality of scan signal lines 430 extending in the second direction (Y direction in the figure), a plurality of reset control signal lines 440 extending in the second direction, a plurality of light emitting control signal lines 450 extending in the second direction, and gate electrodes of the second reset transistor T1, the threshold compensation transistor T2, the driving transistor T3, the data writing transistor T4, the second light emitting control transistor T5, the first light emitting control transistor T6 and the first reset transistor T7.

For example, as shown in FIG. 3A, the gate electrode of the data writing transistor T3 can be a part of the scan signal line 430 which is overlapped with the active semiconductor layer 3100; the gate electrode of the first light emitting control transistor T6 can be a first part of the light emitting control signal line 450 which is overlapped with the active semiconductor layer 3100, and the gate electrode of the second light emitting control transistor T5 can be a second part of the light emitting control signal line 450 which is overlapped with the active semiconductor layer 3100. The gate electrode of the second reset transistor T1 is a first part of the reset control signal line 440 which is overlapped with the active semiconductor layer 3100, and the gate electrode of the first reset transistor T7 is a second part of the reset control signal line 440 which is overlapped with the active semiconductor layer 3100. The threshold compensation transistor T2 can be a thin film transistor with a dual-gate structure, a first gate electrode T2-g1 of the threshold compensation transistor T2 can be a part of a protruding structure P protruding from the scan signal line 430 which is overlapped with the active semiconductor layer 3100, and a second gate electrode T2-g2 of the threshold compensation transistor T2 can be a part of the scan signal line 430 which is overlapped with the active semiconductor layer 3100. As shown in FIG. 3A, the gate electrode of the driving transistor T1 can be the second electrode CC2 of the capacitor C.

It should be noted that the dashed rectangular frames in FIG. 3A show the overlapping parts of the active semiconductor layer 3100 and the first conductive layer 3200, that is, the channel regions. As to the channel region of each transistor, the active semiconductor layers at both sides of each channel region are conductive by processes such as ion doping, and serve as the first electrode and the second electrode of each transistor. The source electrode and the drain electrode of the transistor can be symmetrical in structure, so the source electrode and the drain electrode can be indistinguishable in physical structure. In the embodiments of the present disclosure, in order to distinguish different electrodes of a transistor, it is directly described that one of them is the first electrode and another of them is the second electrode, except for the gate electrode which serves as a control electrode. Therefore, the first electrode and the second electrode of all or part of the transistors in the embodiments of the present disclosure can be interchanged as required.

For example, as shown in FIG. 3A, the scan signal line 430, the reset control signal line 440, and the light emitting control signal line 450 are arranged in the first direction (X direction). The scan signal line 430 is located between the reset control signal line 440 and the light emitting control signal line 450.

For example, in the first direction, the second electrode CC2 of the capacitor C (i.e., the gate electrode of the driving transistor T1) is located between the scan signal line 430 and the light emitting control signal line 450. The protruding structure P protruding from the scan signal line 430 is located at one side of the scan signal line 430 away from the light emitting control signal line 450.

For example, a first insulating layer is formed on the first conductive layer 3200 described above, so as to insulate the first conductive layer 3200 from a second conductive layer 3300 formed subsequently.

Figure 3B:
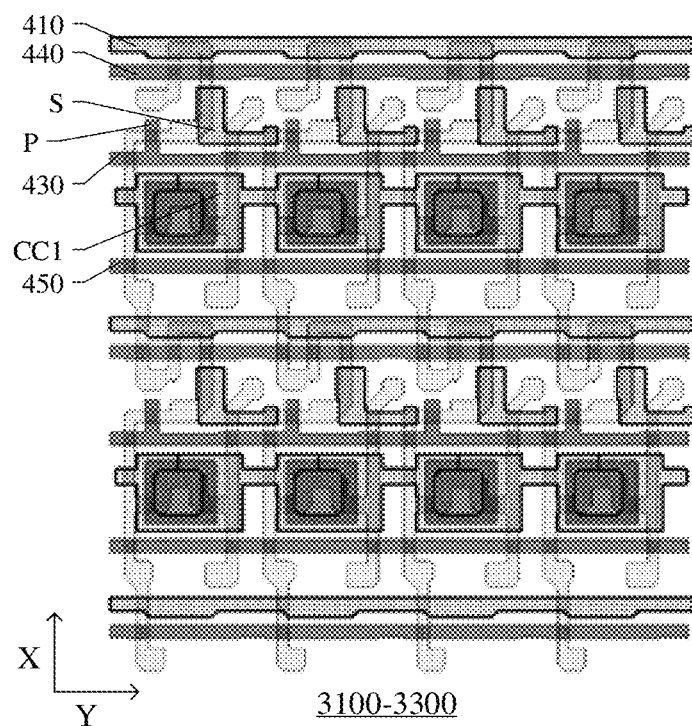
FIG. 3B is a schematic diagram of a partial planar structure of a laminated structure of an active semiconductor layer, a first conductive layer and a second conductive layer according to an embodiment of the present disclosure.

FIG. 3B is a schematic diagram of a partial planar structure of a laminated structure of an active semiconductor layer, a first conductive layer and a second conductive layer according to an embodiment of the present disclosure. As shown in FIG. 3B, the second conductive layer 3300 includes the first electrode CC1 of the capacitor C and a plurality of reset power signal lines 410 extending in the second direction. The first electrode CC1 of the capacitor C is at least partially overlapped with the second electrode CC2 of the capacitor C to form the capacitor C.

For example, the second conductive layer 3300 further includes a plurality of covering portions S, and each threshold compensation transistor T2 includes two gate electrodes T2-g1 and T2-g2 and an active semiconductor layer 3100 located between the orthographic projections of the two gate electrodes on the active semiconductor layer 3100. In the direction perpendicular to the base substrate, the covering portion S is overlapped with the active semiconductor layer 3100 between the two gate electrodes.

For example, a second insulating layer is formed on the second conductive layer 3300 described above, so as to insulate the second conductive layer 3300 from a source-drain metal layer 3400 formed subsequently.

Figure 3C:
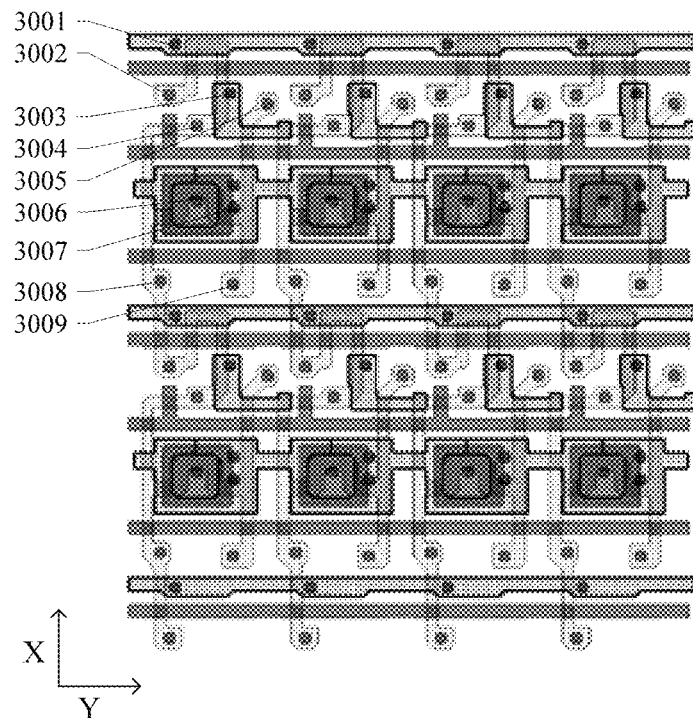
FIG. 3C is a schematic diagram of positions of via holes in each insulating layer according to an embodiment of the present disclosure.
Figure 3D:
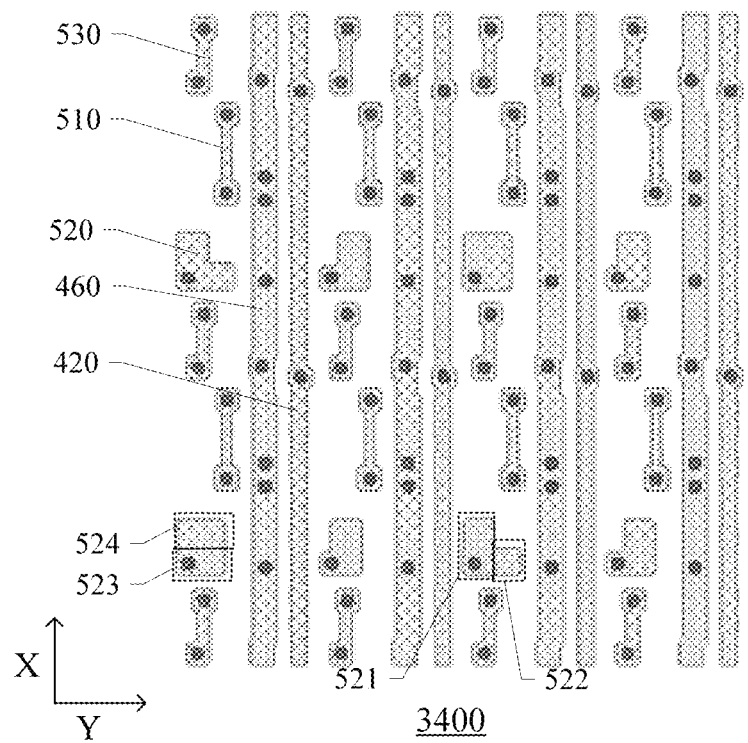
FIG. 3D is a schematic diagram of a partial planar structure of a source-drain metal layer according to an embodiment of the present disclosure.
Figure 3E:
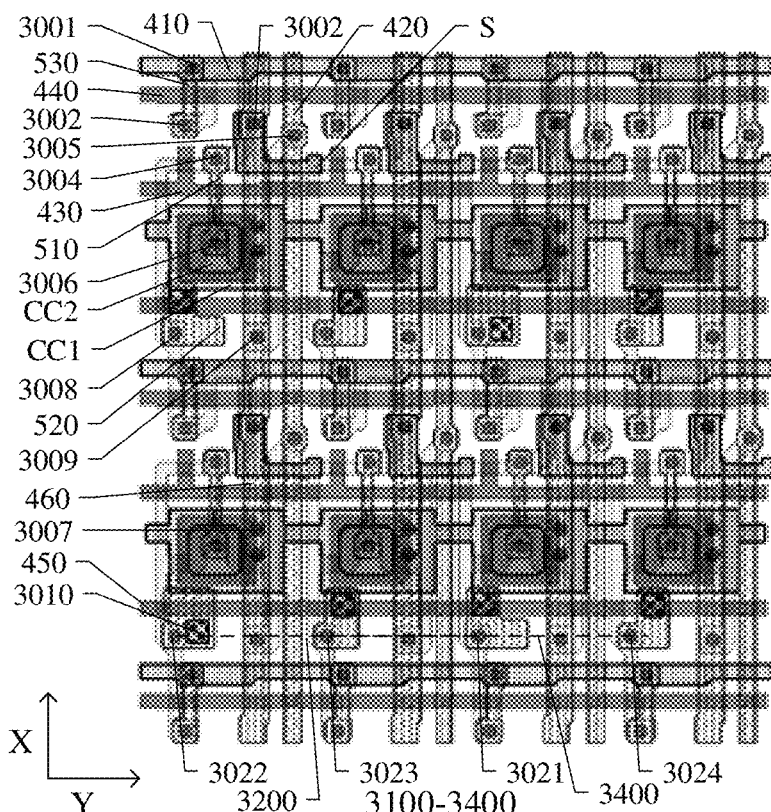
FIG. 3E is a schematic diagram of a laminated structure of an active semiconductor layer, a first conductive layer, a second conductive layer and a source-drain metal layer according to an embodiment of the present disclosure.

For example, FIG. 3C is a schematic diagram of positions of via holes in each insulating layer according to an embodiment of the present disclosure, FIG. 3D is a schematic diagram of a partial planar structure of a source-drain metal layer according to an embodiment of the present disclosure, and FIG. 3E is a schematic diagram of a laminated structure of an active semiconductor layer, a first conductive layer, a second conductive layer and a source-drain metal layer according to an embodiment of the present disclosure. As shown in FIGS. 3C-3E, the source-drain metal layer 3400 includes a data line 420 and a power signal line 460 which extend in the first direction. The data line 420 is electrically connected with the second electrode of the data writing transistor T2 through a via hole 3005 penetrating through the gate insulating layer 2 (shown in FIGS. 5D-5H), the first insulating layer 3 (shown in FIGS. 5D-5H) and the second insulating layer 4 (shown in FIGS. 5D-5H). The power signal line 460 is electrically connected with the first electrode of the second light emitting control transistor T5 through a via hole 3009 penetrating through the gate insulating layer 2, the first insulating layer 3 and the second insulating layer 4. The power signal lines 460 and the data lines 420 are alternately arranged in the second direction. The power signal line 460 is electrically connected with the first electrode CC1 of the capacitor C (e.g., the first electrode 120-CC1 of the capacitor C of the second pixel block 120 or the first electrode 300-CC1 of the capacitor C of the third color sub-pixel 300) through the via hole 3007 penetrating through the second insulating layer 4. For example, the second insulating layer 4 described above is an interlayer insulating layer.

For example, a dual-gate threshold compensation transistor can reduce leakage current. For example, when the threshold compensation transistor T2 is turned off, the active semiconductor layer between the two channels of the dual-gate threshold compensation transistor T2 is in a floating state and is easy to jump due to the influence of surrounding line voltages, thus affecting the leakage current of the threshold compensation transistor T2 and further affecting the luminous brightness. In order to keep the voltage of the active semiconductor layer between the two channels of the threshold compensation transistor T2 stable, the covering portion S is designed to form a capacitor with the active semiconductor layer between the two channels of the threshold compensation transistor T2, and the covering part S can be connected with the power signal line 460 to obtain a constant voltage, so the voltage of the active semiconductor layer in the floating state can be kept stable. The active semiconductor layer between the two channels of the dual-gate threshold compensation transistor T2 is overlapped with the covering portion S, which can also prevent the active semiconductor layer between the two gate electrodes from being illuminated to change its characteristics, for example, to prevent the voltage of this part of the active semiconductor layer from being changed so as to avoid crosstalk. For example, as shown in FIGS. 3C-3E, the power signal line 460 can be electrically connected with the covering portion S through a via hole 3003 penetrating the second insulating layer to provide a constant voltage to the covering portion S.

For example, a passivation layer 5 and a planarization layer 6 (shown in FIGS. 5D-5H) can be sequentially disposed at one side of the source-drain metal layer 3400 away from the base substrate and be configured for protecting the source-drain metal layer 3400. For example, the planarization layer 6 can be located at one side of the passivation layer 5 away from the base substrate. Of course, the embodiments of the present disclosure are not limited to this case. For example, the positions of the planarization layer 6 and the passivation layer 5 can be interchanged, that is, the passivation layer can be located at one side of the planarization layer away from the source-drain metal layer, or as shown in FIG. 5I, only the planarization layer 6 is provided while the passivation layer 5 is not provided.

For example, as shown in FIGS. 3C-3E and FIG. 5D, the pixel circuit of each sub-pixel further includes a first connecting portion 510 arranged in the same layer as the data line 420, and the first connecting portion 510 extends along the first direction. The second electrode of the threshold compensation transistor T2 is electrically connected with the gate electrode of the driving transistor T3 through the first connecting portion 510, and a first electrode of the first connecting portion 510 is connected with the second electrode of the threshold compensation transistor T2 (e.g., the second electrode 110-T2-2 of the threshold compensation transistor T2 of the first pixel block 110, or the second electrode 120-T2-2 of the threshold compensation transistor T2 of the second pixel block 120, or the second electrode 200-T2-2 of the threshold compensation transistor T2 of the second color sub-pixel 200) through the via hole 3004 penetrating through the gate insulating layer 2, the first insulating layer 3 and the second insulating layer 4, and a second electrode of the first connecting portion 510 is connected with the gate electrode of the driving transistor T3 (e.g., the gate electrode 110-T3-g of the driving transistor T3 of the first pixel block 110, or the gate electrode 120-T3-g of the driving transistor T3 of the second pixel block 120) through the via hole 3006 penetrating through the first insulating layer 3 and the second insulating layer 4. The pixel circuit of each sub-pixel further comprises a second connecting portion 520 and a third connecting portion 530 which are arranged in the same layer as the data line 420; the second connecting portion 520 is connected with the second electrode of the first light emitting control transistor T6 through a via hole 3008 penetrating through the gate insulating layer 1, the first insulating layer 2 and the second insulating layer 3; one end of the third connecting portion 530 is connected with the first electrode of the first reset transistor T7 through a via hole 3002 penetrating through the gate insulating layer 1, the first insulating layer 2 and the second insulating layer 3, and the other end of the third connecting portion 530 is connected with the reset power signal line 410 through a via hole 3001 penetrating through the second insulating layer. For example, the first connecting portion 510 is overlapped with the first electrode CC1 of the capacitor C (e.g., the first electrode 110-CC1 in the first pixel block 110 or the first electrode 120-CC1 in the second pixel block 120).

Figure 4:
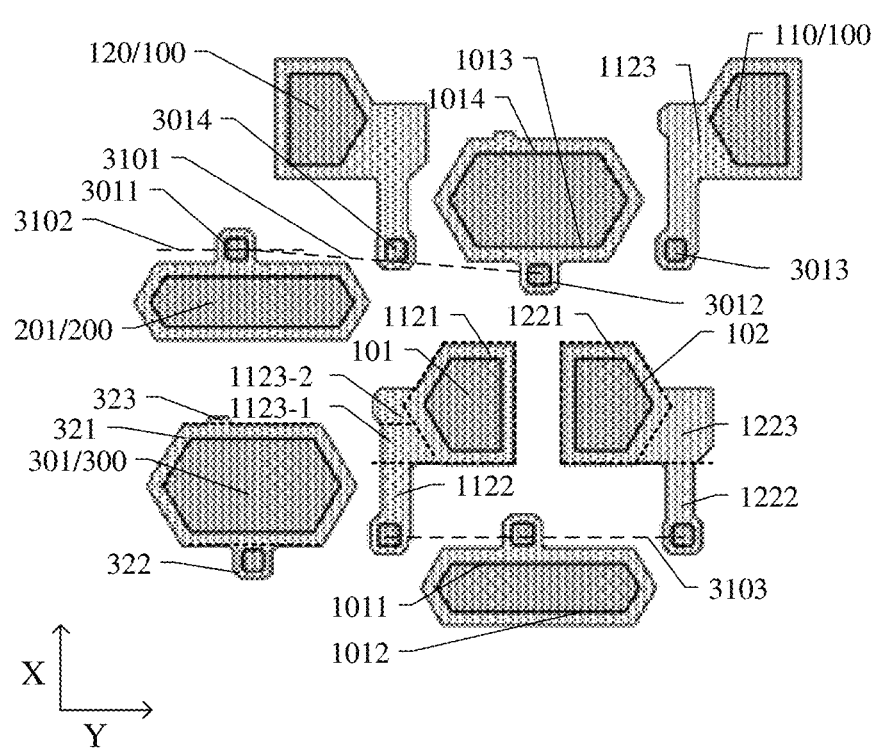
FIG. 4 is a schematic diagram of a second electrode and an effective light emitting region of a light emitting element in each sub-pixel according to an embodiment of the present disclosure.
Figure 5A:
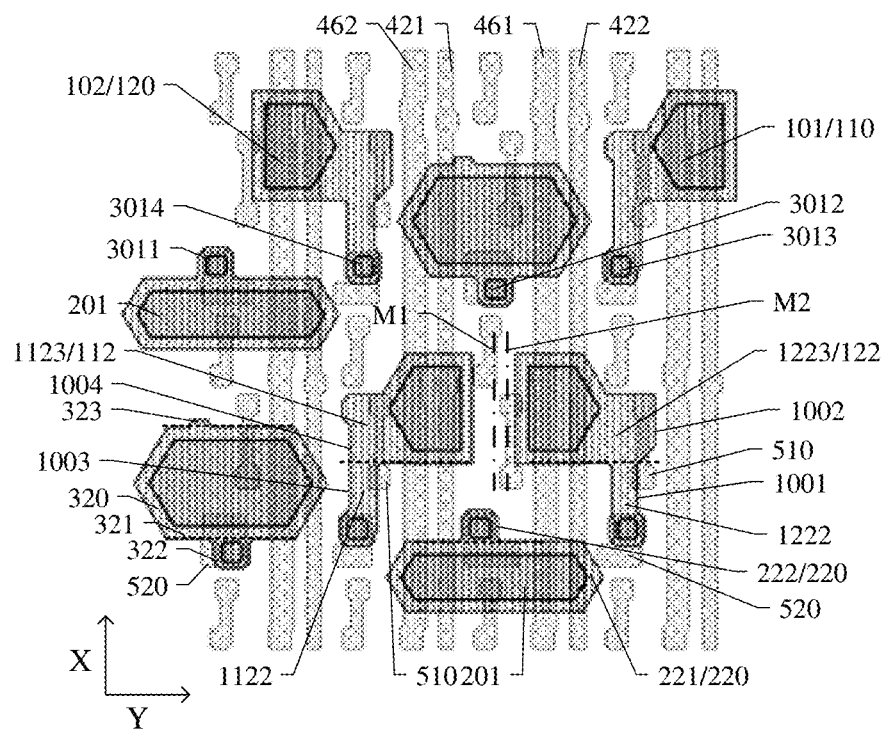
FIG. 5A is a schematic diagram of a laminated structure of a light emitting element and a source-drain metal layer in each sub-pixel according to an embodiment of the present disclosure.
Figure 5B:
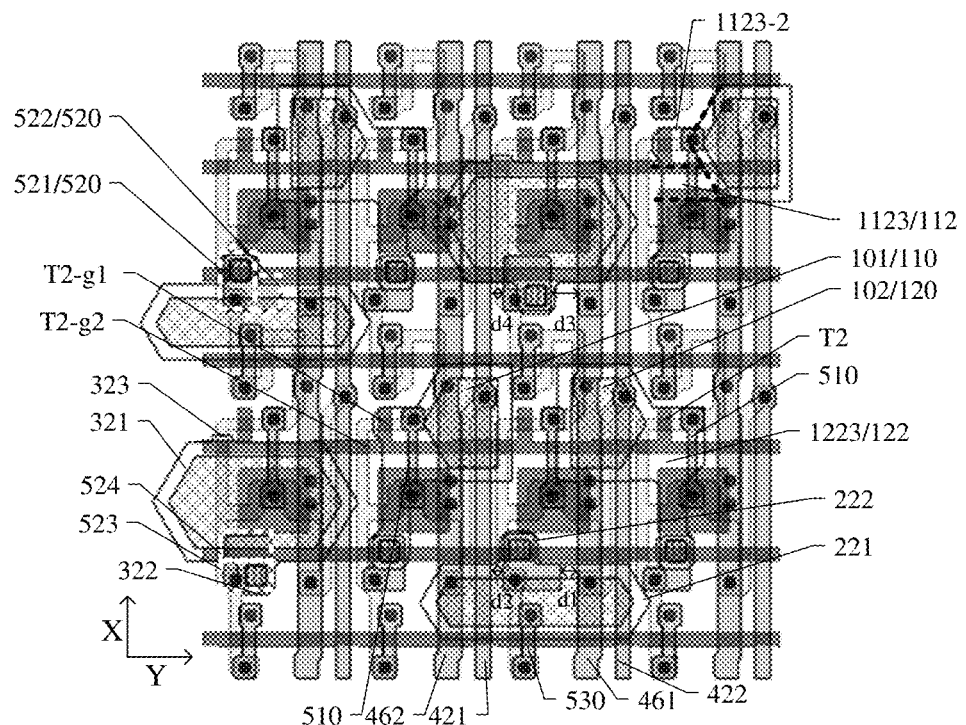
FIG. 5B is a schematic diagram of a laminated structure of a light emitting element, an active semiconductor layer, a first conductive layer and a source-drain metal layer in each sub-pixel according to an embodiment of the present disclosure.
Figure 5C:
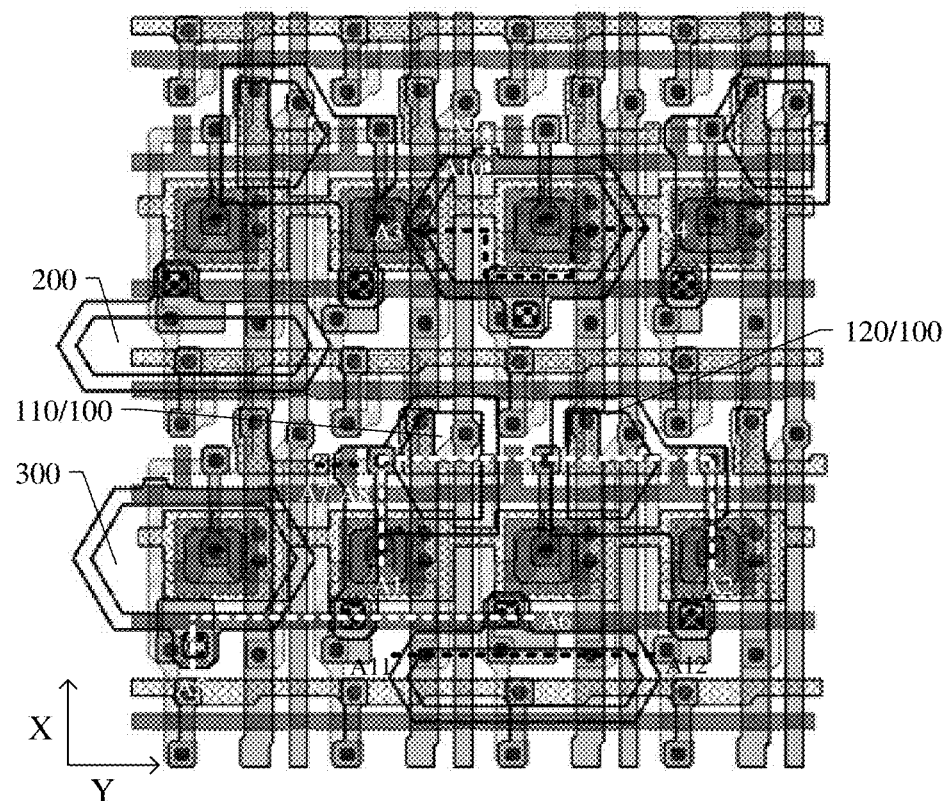
FIG. 5C is a schematic diagram of a laminated structure of a light emitting element, an active semiconductor layer, a first conductive layer, a second conductive layer and a source-drain metal layer in each sub-pixel according to an embodiment of the present disclosure.
Figure 5D:
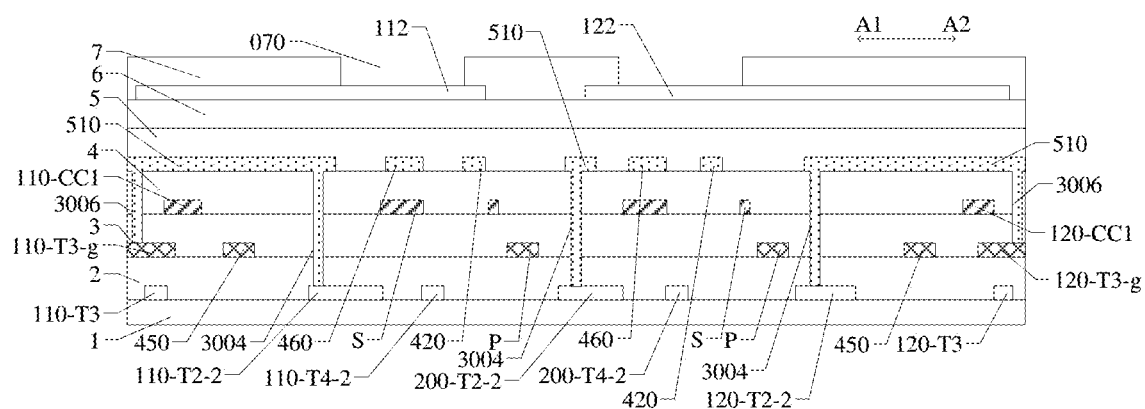
FIG. 5D is a cross-sectional view taken along line A1A2 shown in FIG. 5C.
Figure 5E:
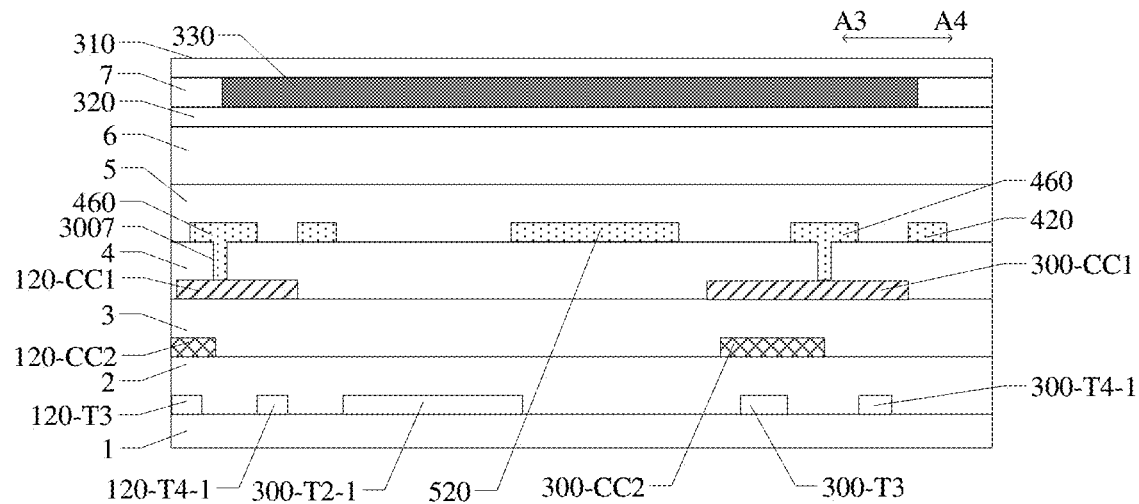
FIG. 5E is a cross-sectional view taken along line A3A4 shown in FIG. 5C.
Figure 5F:
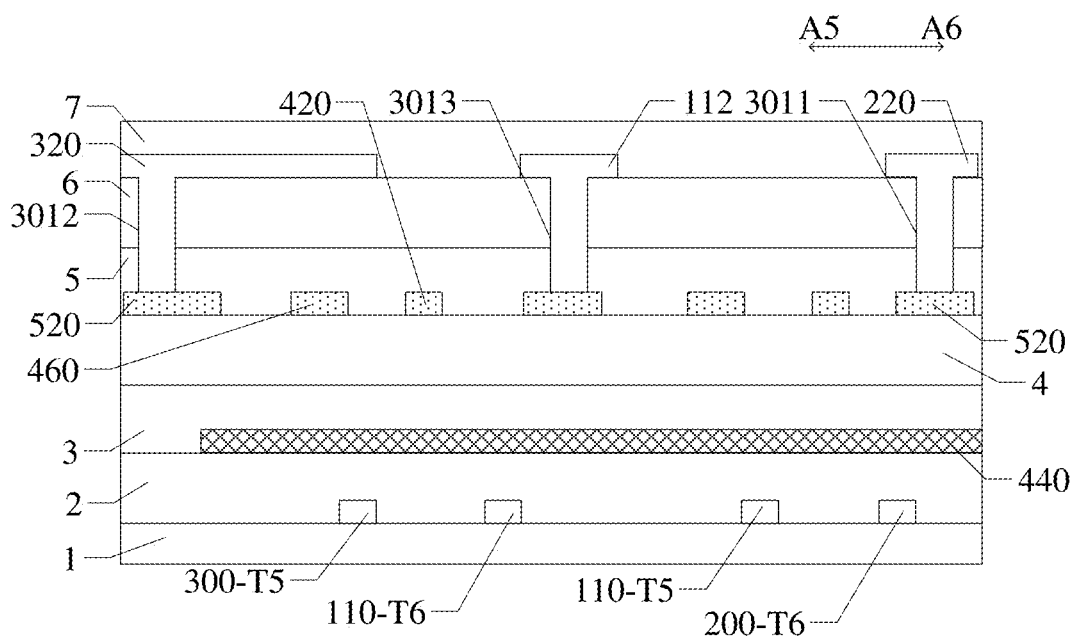
FIG. 5F is a cross-sectional view taken along line A5A6 shown in FIG. 5C.
Figure 5G:
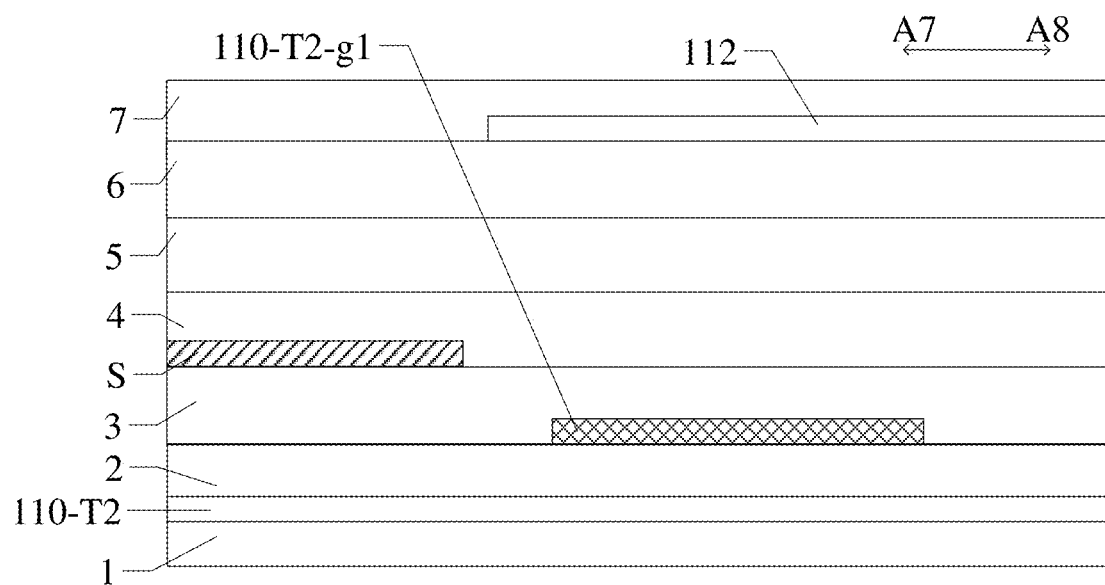
FIG. 5G is a cross-sectional view taken along line A7A8 shown in FIG. 5C.

For example, FIG. 4 is a schematic diagram of a second electrode and an effective light emitting region of a light emitting element in each sub-pixel according to an embodiment of the present disclosure, FIG. 5A is a schematic diagram of a laminated structure of a light emitting element and a source-drain metal layer in each sub-pixel according to an embodiment of the present disclosure, FIG. 5B is a schematic diagram of a laminated structure of a light emitting element, an active semiconductor layer, a first conductive layer and a source-drain metal layer in each sub-pixel according to the embodiment of the present disclosure, and FIG. 5C is a schematic diagram of a laminated structure of a light emitting element, an active semiconductor layer, a first conductive layer, a second conductive layer and a source-drain metal layer in each sub-pixel according to the embodiment of the present disclosure. As shown in FIGS. 4-5C, each first color sub-pixel pair 100 includes a first pixel block 110 and a second pixel block 120 arranged in the second direction (Y direction), the first pixel block 110 includes a first effective light emitting region 101, and the second pixel block 120 includes a second effective light emitting region 102. In the first pixel block 110, a minimum distance between an orthographic projection of the first connecting portion 510 on a straight line extending in the second direction and an orthographic projection of the first effective light emitting region 101 on the straight line is a first distance, or the orthographic projection of the first connecting portion 510 on the straight line extending in the second direction is overlapped with the orthographic projection of the first effective light emitting region 101 on the straight line; and in the second pixel block 120, a minimum distance between an orthographic projection of the first connecting portion 510 on the straight line and the orthographic projection of the second effective light emitting region 102 on the straight line is a second distance, and the first distance is less than the second distance. In the first pixel block 110, an overlapping area between the orthographic projection of the second electrode 112 on the base substrate and the orthographic projection of the first connecting portion 510 on the base substrate is a first overlapping area; in the second pixel block 120, an overlapping area between the orthographic projection of the second electrode 122 on the base substrate and the orthographic projection of the first connecting portion 510 on the base substrate is a second overlapping area; and a ratio of the first overlapping area to the second overlapping area is in a range from, for example, 0.8 to 1.2, for example, 0.9 to 1.1.

In the embodiments of the present disclosure, the display substrate further includes sub-pixels of other colors, and a minimum distance between the first pixel block and the second pixel block in each first color sub-pixel pair is not greater than a minimum distance between two sub-pixels of the same color in the plurality of sub-pixels of other colors. For example, the first color sub-pixel pair is a green sub-pixel pair, sub-pixels of other colors include red sub-pixels, and the minimum distance between two green sub-pixels in the green sub-pixel pair is less than the minimum distance between two red sub-pixels.

For example, in the first pixel block 110, a minimum distance between a center of the orthographic projection of the first connecting portion 510 on the straight line extending in the second direction and a center of the orthographic projection of the first effective light emitting region 101 on the straight line is the first distance; in the second pixel block 120, a minimum distance between a center of the orthographic projection of the first connecting portion 510 on the straight line and a center of the orthographic projection of the second effective light emitting region 102 on the straight line is the second distance; and the first distance is less than the second distance.

In the first color sub-pixel pair, in the case where a distance between the geometric center of the first effective light emitting region and an edge of the first connecting portion of the first pixel block close to the first effective light emitting region is not equal to a distance between the geometric center of the second effective light emitting region and an edge of the first connecting portion of the second pixel block close to the second effective light emitting region, it is easy to occur that areas of two first connecting portions of the two first color sub-pixels covered by the second electrodes are different. As a result, the capacitances formed between the first connecting portions and the second electrodes in the two first color sub-pixels of the same first color sub-pixel pair are different, which leads to a difference between the loads of the gate nodes of the driving transistors in the two first color sub-pixels, and a difference between the brightness when the two first color sub-pixels emit light.

In the embodiments of the present disclosure, the ratio between overlapping areas of the two second electrodes and the two first connecting portions in the two first color sub-pixels of the same first color sub-pixel pair is set to 0.8-1.2, for example, 0.9-1.1. For example, the ratio between the overlapping area of the second electrode and the first connecting portion of one first color sub-pixel and the overlapping area of the second electrode and the first connecting portion in the other first color sub-pixel of the same first color sub-pixel pair is approximately equal to 1, so that the difference between the loads of the gate nodes of the driving transistors in the two first color sub-pixels of the same first color sub-pixel pair can be minimized to ensure that the brightness of the two first color sub-pixels is the same as far as possible when the two first color sub-pixels emit light.

For example, the ratio of the first overlapping area to the second overlapping area is 1, that is, the two overlapping areas are completely the same, thus ensuring that the brightness of the two first color sub-pixels is the same when the two first color sub-pixels emit light.

For example, in the first pixel block 110, the second electrode 112 covers 60%-90% of the area of the first connecting portion 510; and in the second pixel block 120, the second electrode 122 covers 60%-90% of the area of the first connecting portion 510. For example, in the first pixel block 110, the second electrode 112 covers 70-80% of the area of the first connecting portion 510; and in the second pixel block 120, the second electrode 122 covers 70-80% of the area of the first connecting portion 510. For example, considering that there is a certain distance between the second electrode of the second pixel block and the second electrode of a third color sub-pixel (described later), a ratio of the area of the first connecting portion covered by the second electrode in the second pixel block to the area of the first connecting portion cannot be too large, for example, 70%; in order to ensure that the area, of the first connecting portion, covered by the second electrode in the first pixel block is approximately the same as the area, of the first connecting portion, covered by the second electrode in the second pixel block, the ratio of the area, of the first connecting portion, covered by the second electrode in the first pixel block to the area of the first connecting portion is set as, for example, 70%.

For example, as shown in FIGS. 4-5C, relative positional relationships between the gate electrodes of the threshold compensation transistors T2 and the first connecting portions 510 are basically the same in respective pixel circuits, and for example, the first connecting portion 510 is located between the gate electrode of the threshold compensation transistor T2 and the second electrode of the data writing transistor T4.

For example, the two effective light emitting regions in the first color sub-pixel pair 100 are approximately the same in shape and size, and are symmetrically distributed with a straight line passing through the midpoint of the central line of the two effective light emitting regions and extending in the first direction as the central axis.

For example, the shapes of the first effective light emitting region 101 and the second effective light emitting region 102 can include pentagons, circles or water drop shapes. For example, the shapes of the first effective light emitting region 101 and the second effective light emitting region 102 can be pentagons. The pentagon includes a pair of parallel opposite sides (parallel to the second direction) and a vertical side (parallel to the first direction), and the vertical side is perpendicular to the pair of parallel opposite sides. Two vertical sides of the two effective light emitting regions in each first color sub-pixel pair 100 are adjacent to each other, and each pentagon includes a sharp corner opposite to the vertical side, and the two sharp corners of the two effective light emitting regions in each first color sub-pixel pair 100 are away from each other. For example, the distance between the two sharp corners of the two effective light emitting regions in the same first color sub-pixel pair 100 is greater than the length of the effective light emitting region of the second color sub-pixel 200 and the length of the effective light emitting region of the third color sub-pixel 300.

In addition, although the shape of the effective light emitting region of the first color sub-pixel in the figure includes a strict corner formed by two line segments, in some embodiments, the shape of the effective light emitting region of the first color sub-pixel can be a shape with rounded corners, such as a circle or a water drop shape. That is, on the basis of the above pentagonal shape, the corners of the effective light emitting region of the first color sub-pixel are rounded. For example, when an opening of the pixel defining layer is formed, the part at the corner of the opening will be formed as a shape with rounded corners, so that the shape of the light emitting region being formed is a shape with rounded corners.

For example, as shown in FIGS. 4-5C, the first effective light emitting region 101 and the second effective light emitting region 102 are located between the two first connecting portions 510 in the first color sub-pixel pair 100, and a perpendicular bisector M1 connecting the midpoints of the two vertical sides of the first effective light emitting region 101 and the second effective light emitting region 102 is located at one side of a perpendicular bisector M2 connecting the two midpoints of the two first connecting portions 510 close to the first connecting portion 510 of the first pixel block 110. Therefore, the distance between the center of the first effective light emitting region and a corresponding first connecting portion is less than the distance between the center of the second effective light emitting region and a corresponding first connecting portion.

For example, as shown in FIGS. 4-5C, in the first pixel block 110, the gate electrode of the threshold compensation transistor T2 is located at one side of the first connecting portion 510 away from the first effective light emitting region 101, that is, in the first pixel block 110, the first connecting portion 510 is closer to the first effective light emitting region 101 than the gate electrode of the threshold compensation transistor T2. In the second pixel block 120, the gate electrode of the threshold compensation transistor T2 is located at one side of the first connecting portion 510 close to the second effective light emitting region 102, that is, in the second pixel block 120, and the gate electrode of the threshold compensation transistor T2 is closer to the second effective light emitting region 102 than the first connecting portion 510. Therefore, a distance between the first connecting portion of the second pixel block and the center of the second effective light emitting region is greater than a distance between the first connecting portion of the first pixel block and the center of the first effective light emitting region.

For example, as shown in FIGS. 4-5C, the maximum length of the second electrode 122 of the second pixel block 120 in the second direction is greater than the maximum length of the second electrode 112 of the first pixel block 110 in the second direction, so that the overlapping areas of the second electrodes of the two first color sub-pixels and the corresponding first connecting portions are basically equal.

For example, as shown in FIGS. 4-5C, the second electrode of each sub-pixel includes a main body electrode and a connecting electrode. For example, the second electrode 112 in the first pixel block 110 includes a main body electrode 1121 and a connecting electrode 1122, and the shape of the main body electrode 1121 is approximately the same as the shape of the first effective light emitting region 101, such as a pentagon. For example, the orthographic projection of the first effective light emitting region on the base substrate is located within the orthographic projection of the main body electrode on the base substrate. For example, the orthographic projection of the main body electrode 1121 on the base substrate is overlapped with the orthographic projection of the first connecting portion 510 on the base substrate. For example, the second electrode 122 in the second pixel block 120 includes a main body electrode 1221 and a connecting electrode 1122, and the shape of the main body electrode 1221 is approximately the same as the shape of the second effective light emitting region 102, such as a pentagon. For example, the orthographic projection of the second effective light emitting region on the base substrate is located within the orthographic projection of the main body electrode on the base substrate. For example, the orthographic projection of the main body electrode 1221 on the base substrate is not overlapped with the orthographic projection of the first connecting portion 510 on the base substrate.

For example, as shown in FIGS. 4-5C, in the first color sub-pixel pair 100, the second electrode further includes an auxiliary electrode connecting the main body electrode with the connecting electrode. For example, the second electrode 112 in the first pixel block 110 further includes an auxiliary electrode 1123 connecting the main body electrode 1121 with the connecting electrode 1122, and the connecting electrode 1122 extends in the first direction. For example, the second electrode 121 in the second pixel block 120 further includes an auxiliary electrode 1223 connecting the main body electrode 1221 and the connecting electrode 1222.

For example, as shown in FIGS. 4-5C, in the first pixel block 110, the auxiliary electrode 1123 is located at one side of the main body electrode 1121 away from the second effective light emitting region 102, and in the second pixel block 120, the auxiliary electrode 1223 is located at one side of the main body electrode 1221 away from the first effective light emitting region 101. That is, the two auxiliary electrodes of the first color sub-pixel pair are located at sides, which are away from each other, of the two effective light emitting regions.

For example, as shown in FIGS. 4-5C, the second electrode in each first color sub-pixel has an integrated structure, that is, the main body electrode, the auxiliary electrode and the connecting electrode included in the second electrode are formed as an integrated structure. In order to clearly describe the shape of the second electrode in the first color sub-pixel and its relationship with other structures, the embodiments of the present disclosure divide the second electrode in the first color sub-pixel into a main body electrode, an auxiliary electrode and a connecting electrode.

For example, as shown in FIGS. 4-5C, in the first color sub-pixel pair 100, the two main body electrodes 1121 and 1221 are basically the same in shape and size, the two auxiliary electrodes 1123 and 1223 are different in shape, and the two connecting electrodes 1122 and 1222 are different in shape.

For example, as shown in FIGS. 4-5C, for example, an orthographic projection of, the first edge 1001 away from the second effective light emitting region 102 among edges extending in the first direction in the part of the connecting electrode 1222 close to the auxiliary electrode 1223, on the base substrate, is overlapped with the orthographic projection of the first connecting portion 510 on the base substrate. For example, in the second pixel block 120, the second edge 1002, away from the second effective light emitting region 102 in the Y direction, in the part of the auxiliary electrode 1223 away from the connecting electrode is located at one side of the first connecting portion 510 away from the second effective light emitting region 102, so that the auxiliary electrode 1223 covers at least part of the first connecting portion 510. For example, the part of the connecting electrode 1222 away from the auxiliary electrode 1223 is configured to be connected with the second connecting portion 520, and according to the size of the via hole provided in the planarization layer, the width of the part of the connecting electrode 1222 away from the auxiliary electrode 1223 in the Y direction is greater than the width of the part of the connecting electrode 1222 close to the auxiliary electrode 1223. Therefore, the edge, away from the second effective light emitting region 102, among edges extending in the first direction in the part of the connecting electrode 1222 away from the auxiliary electrode 1223 is not on the same straight line as the first edge 1001.

For example, as shown in FIGS. 4-5C, in the first pixel block 110, a part of the connecting electrode 1122 close to the auxiliary electrode 1123 includes edges extending in the first direction, one of the edges the third edge 1003 away from the first effective light emitting region 101 is the third edge 1003, a straight line where the third edge 1003 is located is located at one side of the first connecting portion 510 away from the first effective light emitting region 101. For example, the orthographic projection of the third edge 1003 in the part of the connecting electrode 1122 close to the auxiliary electrode 1123 on the base substrate is not overlapped with the orthographic projection of the first connecting portion 510 on the base substrate. For example, the part of the connecting electrode 1122 away from the auxiliary electrode 1123 is configured to be connected with the second connecting portion 520, and according to the size of the via hole provided in the planarization layer, the width of the part of the connecting electrode 1122 away from the auxiliary electrode 1123 in the Y direction is greater than the width of the part of the connecting electrode 1122 close to the auxiliary electrode 1123. Therefore, the edge, away from the first effective light emitting region 101, among edges extending in the first direction in the part of the connecting electrode 1122 away from the auxiliary electrode 1123 is not on the same straight line as the third edge 1003.

For example, as shown in FIGS. 4-5C, in the first pixel block 110, a fourth edge 1004 away from the first effective light emitting region 101 in the part of the auxiliary electrode 1123 (e.g., the first part 1123-1 of the auxiliary electrode 1123 described later) connected with the connecting electrode 1122 is on the same straight line as the third edge 1003 of the connecting electrode 1122, so as to facilitate the fabrication of the second electrode.

For example, in the second pixel block 120, the edge away from the second effective light emitting region 102 in the part of the auxiliary electrode 1223 close to the connecting electrode 1222 is not on the same straight line as the first edge 1001 of the connecting electrode 1222. For example, in the second pixel block 120, the second edge 1002, away from the second effective light emitting region 102 and extending in the first direction, in the part of the auxiliary electrode 1223 away from the connecting electrode 1222 is not on the same straight line as the first edge 1001 of the connecting electrode 1222. For example, in the second pixel block 120, the straight line where the second edge 1002 is located of the auxiliary electrode 1223 is located at one side of the straight line where the first edge 1001 is located of the connecting electrode 1221 away from the second effective light emitting region 102, so that the auxiliary electrode 1223 covers the first connecting portion 510. For example, a connecting edge between the first edge 1001 and the second edge 1002 can be a straight edge intersected with the X direction, but is not limited thereto, and can also be a fold line edge or a curved edge.

The embodiments of the present disclosure illustratively show that the first edge, the second edge, the third edge and the fourth edge are straight edges for convenience of manufacturing, but they are not limited thereto, and can also be curved edges or fold line edges, as long as the extending direction thereof extends in the X direction.

Because the third edge of the connecting electrode of the first pixel block is located at one side of the connecting electrode away from the first effective light emitting region, the edge of the auxiliary electrode connected with the connecting electrode is located on the same straight line with the third edge of the connecting electrode, so that the auxiliary electrode can also realize to overlap with the first connecting portion, and then, the edges, away from the first connecting portion, in the parts of the auxiliary electrode and the connecting electrode close to each other can be designed to be on the same straight line for convenience of manufacturing.

The straight line where the first edge is located of the connecting electrode in the second pixel block is overlapped with the first connecting portion. Assuming that the second edge of the auxiliary electrode of the second pixel block is on the same straight line as the first edge of the connecting electrode, the area of the first connecting portion covered by the auxiliary electrode of the second pixel block is different from the area of the first connecting portion covered by the corresponding auxiliary electrode of the first pixel block, which will lead to the difference in brightness between the two first color sub-pixels. Therefore, in the embodiments of the present disclosure, the first edge of the connecting electrode of the second pixel block is not on the same line as the second edge of the auxiliary electrode, and the straight line of the second edge of the auxiliary electrode is located at one side of the straight line of the first edge of the connecting electrode away from the second effective light emitting region, so that the overlapping areas of the auxiliary electrodes and the first connecting portions in the two first color sub-pixels of the first color sub-pixel pair are basically the same, and the difference in loads of the gate electrodes of the driving transistors in the two first color sub-pixels is reduced, thereby reducing the difference in brightness of the two first color sub-pixels and improving the display characteristics of the display substrate.

For example, as shown in FIGS. 3C-5C, the pixel circuit of each sub-pixel further includes a second connecting portion 520 arranged in the same layer as the first connecting portion 510, and the second connecting portion 520 is electrically connected with the second electrode of the first light emitting control transistor T6 through a via hole 3008 penetrating through the gate insulating layer, the first insulating layer and the second insulating layer. The connecting electrode of the second electrode of each sub-pixel is connected with the second connecting portion through a via hole penetrating through the planarization layer, thereby realizing connection with the first light emitting control transistor.

For example, in the first pixel block 110, the second connecting portion 520 is farther away from the first effective light emitting region 101 than the first connecting portion 510 in the second direction, so that the connecting electrode 1122 is farther away from the first effective light emitting region 101 than the first connecting portion 510 in the second direction. For example, in the second pixel block 120, the second connecting portion 520 is closer to the second effective light emitting region 102 than the first connecting portion 510 in the second direction, so that the connecting electrode 1222 is closer to the second effective light emitting region 102 than the first connecting portion 510 in the second direction.

For example, as shown in FIGS. 3C-5C, a planarization layer is provided between the film layer where the second connecting portion 520 is located and the film layer where the connecting electrode is located, or a passivation layer and a planarization layer are provided between the film layer where the second connecting portion 520 is located and the film layer where the connecting electrode is located. The planarization layer includes a plurality of via holes 3010 penetrating through the planarization layer, and the connecting electrode in each sub-pixel is electrically connected with the second connecting portion 520 through a via hole 3010. For example, the via hole 3010 corresponding to the first pixel block 110 is farther away from the first effective light emitting region 101 than the first connecting portion 510 in the first pixel block 110 in the second direction, so that the connecting electrode 1122 is farther away from the first effective light emitting region 101 than the first connecting portion 510 in the second direction. For example, the via hole 3010 corresponding to the second pixel block 120 is closer to the second effective light emitting region 102 than the first connecting portion 510 in the second pixel block 120 in the second direction, so that the connecting electrode 1222 is closer to the second effective light emitting region 102 than the first connecting portion 510 in the second direction.

Figure 5H:
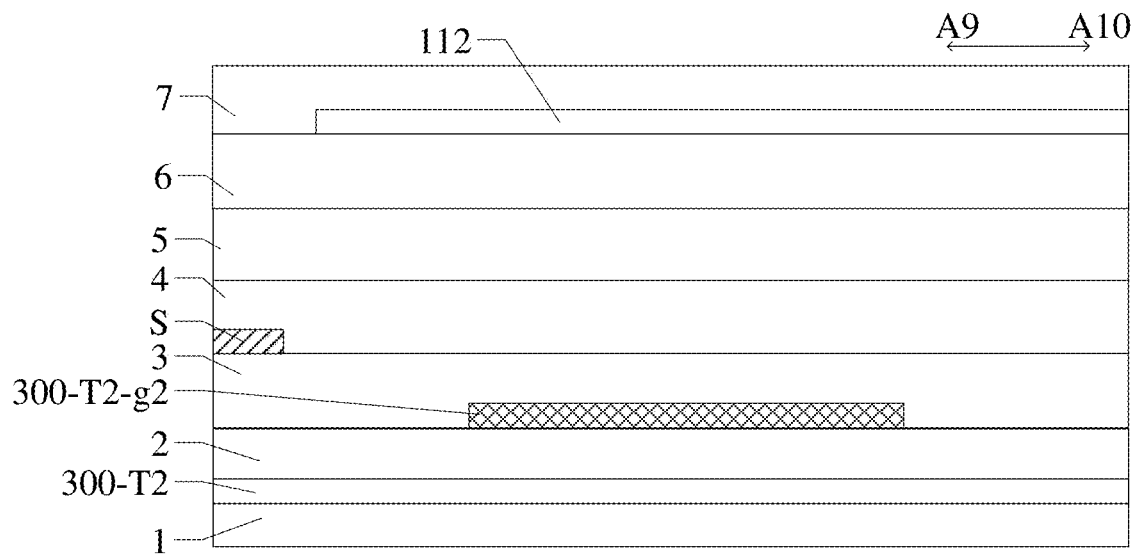
FIG. 5H is a cross-sectional view taken along line A9A10 shown in FIG. 5C according to an example of an embodiment of the present disclosure.
Figure 5I:
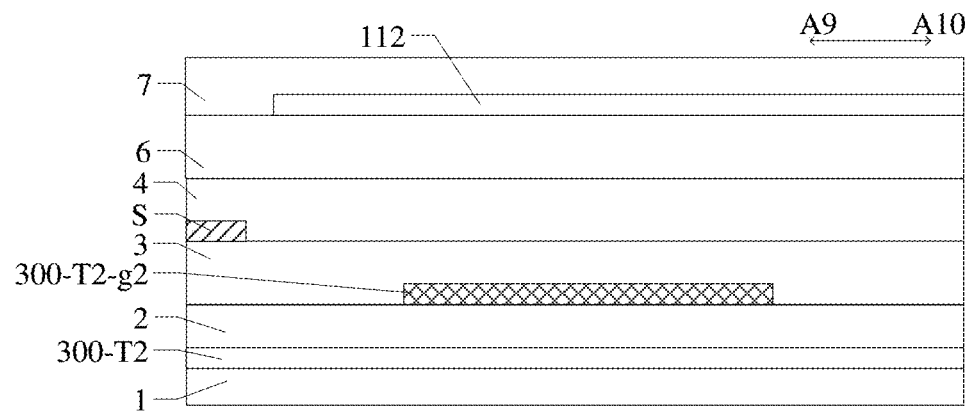
FIG. 5I is a cross-sectional view taken along line A9A10 shown in FIG. 5C according to another example of an embodiment of the present disclosure.
Figure 5J:
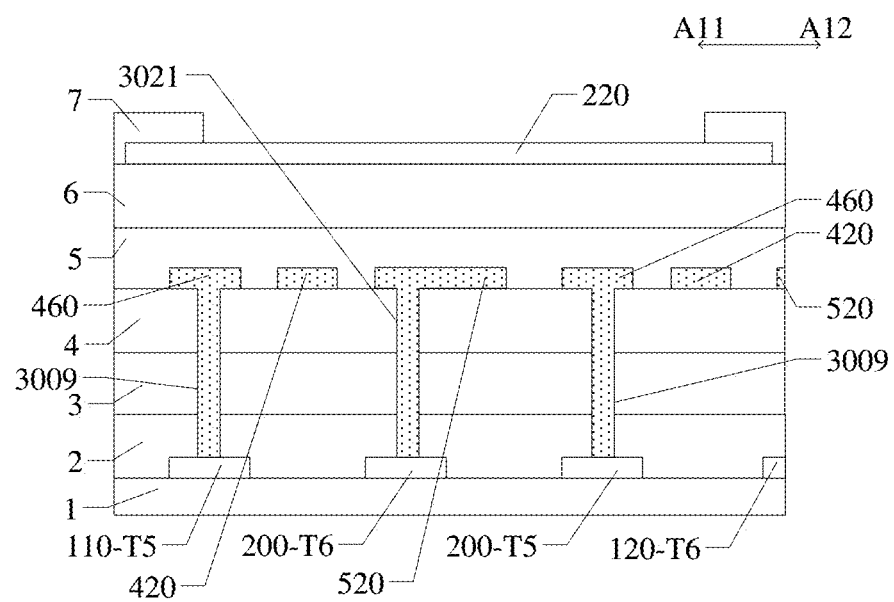
FIG. 5J is a cross-sectional view taken along line A11A12 shown in FIG. 5C.

For example, as shown in FIGS. 4-5J, in the first pixel block 110, the first gate electrode 110-T2-g1 of the threshold compensation transistor T2 is located at one side of the second gate electrode 110-T2-g2 close to the first effective light emitting region 101 in the second direction, the straight line of the third edge 1003 of the connecting electrode 1122 is overlapped with the first gate electrode T2-g1, and the edge of the auxiliary electrode 1123 (e.g., the second portion 1123-2 of the auxiliary electrode 1123 described later) away from the first effective light emitting region 101 is located at one side of the first gate electrode T2-g1 away from the first effective light emitting region 101, so that the auxiliary electrode 1123 is overlapped with the first gate electrode T2-g1. For example, as shown in FIG. 5G, both a protruding structure P and a covering portion S (described later) are overlapped with the active semiconductor layer of the threshold compensation transistor T2. In the embodiments of the present disclosure, by arranging an auxiliary electrode covering the first gate electrode of the threshold compensation transistor in the first pixel block, the external light can be prevented from being directly incident on the channel region of the threshold compensation transistor, and the characteristic deviation of the threshold compensation transistor caused by illumination when the display substrate displays can be avoided.

For example, as shown in FIGS. 4-5C, in the first pixel block 110, the auxiliary electrode 1123 includes a first portion 1123-1 and a second portion 1123-2 which are connected with each other, the first portion 1123-1 is connected with the connecting electrode 1122, the second portion 1123-2 covers at least part of the first gate electrode T2-g1 of the threshold compensation transistor T2, the fourth edge 1004, of the first portion 1123-1, extending in the first direction is located on the same straight line as the third edge 1003 of the connecting electrode 1122, and the edge of the second portion 1123-2 extending in the first direction is farther away from the first effective light emitting region 101 in the Y direction than the fourth edge 1004. For example, the second portion 1123-2 is located at one side of the second gate electrode T2-g2 of the threshold compensation transistor T2 away from the connecting electrode 1122 in the first direction. For example, in the first pixel block 110, the auxiliary electrode 1123 covers a part of the active layer between the first gate electrode T2-g1 of the threshold compensation transistor T2 and the second gate electrode T2-g2 of the threshold compensation transistor T2.

In the embodiments of the present disclosure, a protrusion protruding to one side away from the first effective light emitting region is arranged in the auxiliary electrode of the first pixel block to be overlapped with the first gate electrode of the threshold compensation transistor and the part of the active layer between the first gate electrode and the second gate electrode of the threshold compensation transistor, so that it is ensured that the second electrode of the first pixel block can still cover one channel region of the threshold compensation transistor even if there is a certain degree of misalignment during the formation process of the second electrode, thus preventing the transistor characteristics from shifting due to illumination and further preventing the writing of the gate potential of the driving transistor from being affected.

In the embodiments of the present disclosure, the threshold compensation transistor has a dual-gate structure and has two channel regions, and the second gate electrode of the threshold compensation transistor in the first pixel block is not covered by the second electrode. In order to ensure that at least one channel region of the threshold compensation transistor is in a shielded state to maintain the characteristics of the threshold compensation transistor, the auxiliary electrode of the first pixel block is provided with a protrusion protruding to one side away from the first effective light emitting region, thus ensuring that the first gate electrode of the threshold compensation transistor is completely covered by the second electrode.

For example, the second electrode of the first pixel block is overlapped with one of the two gate electrodes of the threshold compensation transistor, and the second electrode of the second pixel block is overlapped with the two gate electrodes of the threshold compensation transistor.

For example, in the direction perpendicular to the base substrate, the main body electrode of the second electrode of the first pixel block is overlapped with the covering portion S, and the main body electrode of the second electrode of the second pixel block is overlapped with the covering portion S.

For example, as shown in FIGS. 1-5C, the second electrode 320 of the third color sub-pixel 300 further includes an auxiliary electrode 323 located at one side of the main body electrode 321 away from the connecting electrode 322 and connected with the main body electrode 321. The shapes of the main body electrode 321 of the third color sub-pixel 300 and the effective light emitting region 301 are the same, and for example, are hexagons or ovals. And the connecting electrode 322 is connected with the second connecting portion 520 through the via hole 3010 penetrating through the planarization layer to realize the connection with the first light emitting control transistor T6.

For example, as shown in FIGS. 1-5H, in the third color sub-pixel 300, the second gate electrode 300-T2-g2 of the threshold compensation transistor T2 is located at one side of the first gate electrode 300-T2-g1 close to the effective light emitting region 301 of the third color sub-pixel 300, and the auxiliary electrode 323 covers a part of the active layer between the second gate electrode T2-g2 and the first gate electrode T2-g1. For example, as shown in FIG. 5H, both the protruding structure P and the covering portion S (described later) are overlapped with the active semiconductor layer of the threshold compensation transistor T2. In the embodiments of the present disclosure, the threshold compensation transistor has a dual-gate structure and has two channel regions, and the first gate electrode of the threshold compensation transistor in the third color sub-pixel is not covered by the second electrode. In order to ensure that at least one channel region of the threshold compensation transistor is in a shielded state to maintain the characteristics of the threshold compensation transistor, a protruding protrusion is arranged at one side of the main body electrode of the third color sub-pixel away from the connecting electrode to form an auxiliary electrode, so that it is ensured that the second electrode can still cover one channel region of the threshold compensation transistor even if there is a certain degree of misalignment during the formation process, thus preventing the transistor characteristics from shifting due to illumination and further preventing the writing of the gate potential of the driving transistor from being affected.

For example, the light emitting element described above can be an organic light emitting element or an inorganic light emitting element.

For example, as shown in FIG. 5D, a pixel defining layer 7 is provided at one side of the second electrode of each color sub-pixel away from the base substrate, and the pixel defining layer 7 includes an opening 070 to expose part of the second electrode. When an organic light emitting layer is subsequently formed in the opening 070 of the pixel defining layer 7, the organic light emitting layer is contacted with the second electrode, so that this part can drive the organic light emitting layer to emit light.

Figure 6:
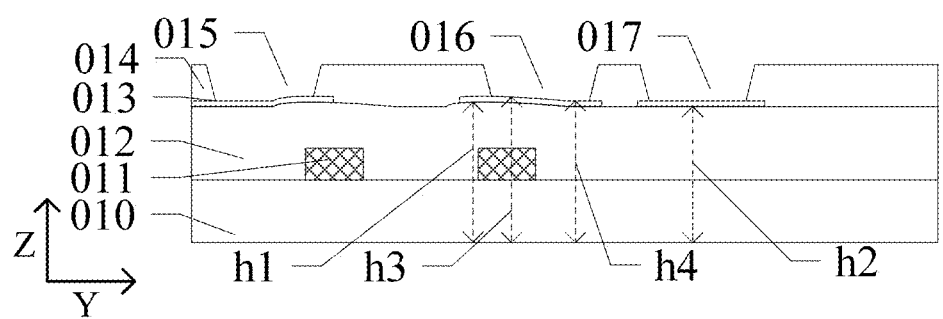
FIG. 6 is a schematic diagram of a partial cross-sectional structure of a display substrate.

For example, FIG. 6 is a schematic diagram of a partial cross-sectional structure of a display substrate. As shown in FIG. 6, the display substrate includes a film layer 010, the film layer includes a base substrate, an active semiconductor layer on the base substrate, and at least one conductive layer on one side of the active semiconductor layer away from the base substrate. The display substrate further includes a source-drain metal layer 011 on the film layer 010. For example, the source-drain metal layer 011 can include wirings such as data lines and power signal lines. The display substrate further includes a planarization layer 012 on one side of the source-drain metal layer 011 away from the film layer 010, an anode 013 on one side of the planarization layer 012 away from the source-drain metal layer 011, and a pixel defining layer 014 on one side of the anode 013 away from the planarization layer 012. The pixel defining layer 014 includes a plurality of openings 015-017 for defining light emitting regions of sub-pixels. The plurality of openings 015-017 expose part of the anodes 013. When organic light emitting layers are subsequently formed in the openings 015-017 of the pixel defining layer 014, the organic light emitting layers are contacted with the anodes 013, so that these part can drive the organic light emitting layers to emit light.

As shown in FIG. 6, the thickness of the source-drain metal layer 011 is relatively large, and for example, the thickness thereof can be 0.6-0.9 microns, which may cause the surface of the planarization layer 012 on the source-drain metal layer 011 facing the anode 013 to be uneven. For example, the distance between the surface of planarization layer 012 away from the film layer 010, which is located directly above the source-drain metal layer 011 (e.g., data lines, power signal lines and patterns of the same layer and material), and the surface of the film layer 010 away from the planarization layer 012 is h1, and the distance between the surface of planarization layer 012 away from the film layer 010, which is located directly above a region where the source-drain metal layer 011 is not provided, and the surface of the film layer 010 away from planarization layer 012 is h2, and h2>h1.

As shown in FIG. 6, in the opening 016, the source-drain metal layer 011 is provided just below one part of the planarization layer 012, while there is no source-drain metal layer 011 just below the other part of the planarization layer 012, so that the surface of the planarization layer 012 facing the anode 013 in the opening 016 is uneven, resulting in an uneven surface of the anode 013 on the planarization layer 012. For example, as to the anode 013 located in the opening 016, the distance between the surface of the anode 013 away from the film layer 010, which is located just above the source-drain metal layer 011, and the surface of the film layer 010 away from the anode 013 is h3, and the distance between the surface of the anode 013 away from the film layer 010, which is located at a position where the source-drain metal layer 011 is not provided, and the surface of the film layer 010 away from the anode 013 is h4, and h3>h4. As a result, the anode 013 in the opening 016 is tilted. In the same way, the anode 013 in the opening 015 is also tilted. And because of the difference of the positions of the source-drain metal layers 011, the tilt direction of the anode 013 in the opening 015 is different from the tilt direction of the anode 013 in the opening 016, which leads to inconsistent luminous intensity of sub-pixels corresponding to the opening 015 and the opening 016 in different directions. With the direction indicated by the arrow in the Y direction as the "right" direction, the intensities of light emitted from the light emitting regions of the sub-pixels defined by the opening 015 and the opening 016 to the left and right sides are inconsistent. There is no source-drain metal layer 011 just below the anode 013 in the opening 017, so the surface of the anode 013 in the opening 017 is basically even without "being tilted", and the luminous intensities of the light emitting region of the sub-pixel defined by the opening 017 is consistent in different directions. As to the light emitting regions of three adjacent sub-pixels of different colors defined by the openings 015-017, the anode 013 in the opening 015 tilts to the left, the anode 013 in the opening 016 tilts to the right, and the anode 013 in the opening 017 does not tilt. Therefore, the "tilted" directions of the anodes 013 of sub-pixels of different colors are different, resulting in mismatched intensities of light emitted from the light emitting regions of the three sub-pixels to the left and right. A display device adopting such a display substrate will have a large viewing angle color shift, and when viewed by human eyes, a color shift phenomenon similar to one side being red and the other side being blue appears.

For example, in the first pixel block, the orthographic projection of the second electrode on the base substrate is overlapped with the orthographic projection of the gate electrode of the driving transistor on the base substrate; and in the second pixel block, the orthographic projection of the second electrode on the base substrate is overlapped with the orthographic projection of the gate electrode of the driving transistor on the base substrate.

For example, in each color sub-pixel, the overlapping area between the orthographic projection of the second connecting portion on the base substrate and the orthographic projection of the first electrode of the capacitor on the base substrate is small.

For example, as shown in FIGS. 5C and 5J, the second electrode of the second color sub-pixel is overlapped with the via holes 3009 and 3021 that connect the source-drain metal layer with the active semiconductor layer.

In another example of the embodiment of the present disclosure, as shown in FIGS. 3A-5C, the plurality of data lines 420 include a plurality of first data lines 421, and the plurality of power signal lines 460 include a plurality of first power signal lines 461. For example, in the third direction perpendicular to the base substrate, the second electrode 220 of the second color sub-pixel 200 is overlapped with the first data line 421, the first power signal line 461 and the second connecting portion 520; for overlapping parts of the first data line 421, the first power signal line 461 and the second connecting portion 520 with the second electrode 220, the overlapping part of the first power signal line 461 and the overlapping part of the first data line 421 are respectively located at both sides of the overlapping part of the second connecting portion 520, and the ratio of the minimum distance d1 (shown in FIG. 5B) between the edges of the second connecting portion 520 and the first power signal line 461 which are close to each other, and the minimum distance d2 (shown in FIG. 5B) between the edges of the second connecting portion 520 and the first data line 421 which are close to each other is in the range from 0.8 to 1.2. For example, the ratio of the minimum distance between the edges of the second connecting portion 520 and the first power signal line 461 which are close to each other and the minimum distance between the edges of the second connecting portion 520 and the first data line 421 which are close to each other is in the range from 0.9 to 1.1. For example, the ratio of the minimum distance between the edges of the second connecting portion 520 and the first power signal line 461 which are close to each other and the minimum distance between the edges of the second connecting portion 520 and the first data line 421 which are close to each other is 1.

In the embodiment of the present disclosure, by setting that the distance between the second connecting portion and the adjacent data line is approximately equal to the distance between the second connecting portion and the adjacent power signal line, the difference of heights between an intermediate region (a region not overlapped with the data line and the power signal line) and two side regions (regions overlapped with the data line and the power signal line) in the second electrode of the second color sub-pixel can be reduced, and the evenness of the second electrode of the second color sub-pixel can be improved, and color shift can be alleviated.

For example, the minimum distance between the first data line 421 and the first power signal line 461 can be 20-25 microns, and the maximum size of the second connecting portion 520 in the Y direction can be 15-20 microns. The embodiment of the present disclosure is not limited to this case, as long as the distance between any two of the first data line, the second connecting portion and the first power signal line is not less than 3 microns.

For example, as shown in FIGS. 3A-5C, in the third direction, the effective light emitting region 201 of each second color sub-pixel 200 is overlapped with the first data line 421, the first power signal line 461 and the second connecting portion 520; and for overlapping parts of the first data line 421, the first power signal line 461 and the second connecting portion 520 with the effective light emitting region 201 of the second color sub-pixel, the ratio of the distance between the edges of the second connecting portion 520 and the first power signal line 461 which are close to each other and the distance between the edges of the second connecting portion 520 and the first data line 421 which are close to each other is in the range from 0.8 to 1.2, and for example, 0.9-1.1. Therefore, the difference of heights between the intermediate region and the two side regions in the second electrode of the second color sub-pixel can be reduced, and the evenness of the second electrode in the effective light emitting region of the second color sub-pixel can be improved, so as to alleviate color shift.

For example, as shown in FIGS. 3A-5C, in the part where the second connecting portion 520 is overlapped with the effective light emitting region 201 of the second color sub-pixel 200, the distance between the second connecting portion 520 and the first data line 421 is approximately equal to the distance between the second connecting portion 520 and the first power signal line 461, which can further ensure the evenness of the second electrode located in the effective light emitting region of the second color sub-pixel to alleviate color shift.

For example, as shown in FIGS. 3A-5C, an orthographic projection of a straight line extending in the X direction and having approximately the same distance to two end points of the effective light emitting region 201 of the second color sub-pixel 200 in the Y direction (the direction intersecting the extending direction of the data line) on the base substrate is overlapped with an orthographic projection of the second connecting portion 520 on the base substrate. For example, the orthographic projection of the straight line extending in the X direction and passing through the midpoint of a connecting line of two end points opposite to each other in the Y direction of the effective light emitting region 201 of the second color sub-pixel 200 on the base substrate is overlapped with the orthographic projection of the second connecting portion 520 on the base substrate. For example, the orthographic projection of the straight line extending along the X direction and passing through the midpoint of a connecting line of two end points of the effective light emitting region 201 of the second color sub-pixel 200 in the Y direction (the direction intersected with the extending direction of the data line) on the base substrate is overlapped with the orthographic projection of the second connecting portion 520 on the base substrate. Therefore, with respect to the distribution positions of the first data line and the first power signal line, in the embodiment of the present disclosure, the central line of the effective light emitting region 201 of the second color sub-pixel 200 extending in the first direction is overlapped with the second connecting portion, which can improve the symmetry of the second electrode and alleviate color shift.

For example, as shown in FIGS. 3A-5C, the second connecting portion 520 includes a first sub-connecting portion 521 and a first block 522 located at one side of the first sub-connecting portion 521 close to the first power signal line 461, the first sub-connecting portion 521 and the first block 522 are connected with each other, and the second electrode 220 of the second color sub-pixel 200 is electrically connected with the second electrode of the first light emitting control transistor T6 through the first sub-connecting portion 521. For example, the first block and the first sub-connecting portion are formed as an integrated structure. According to the embodiment of the present disclosure, the second connecting portion is divided into the first sub-connecting portion and the first block, which can clearly indicate the positional relationships between the second connecting portion, the second electrode of the second color sub-pixel and the effective light emitting region of the second color sub-pixel.

For example, as shown in FIGS. 3A-5C, the shape of the first sub-connecting portion 521 is a rectangle extending in the X direction, and a straight line passing through the center of the effective light emitting region 201 of the second color sub-pixel 200 and extending in the X direction does not coincide with a second straight line passing through the center of the first sub-connecting portion 521 and extending in the X direction. For example, the central line passing through the center of the effective light emitting region 201 of the second color sub-pixel 200 is located at one side of the central line passing through the center of the first sub-connecting portion 521 close to the first block 522. Therefore, the whole of the first sub-connecting portion is on the left with the central line of the second color sub-pixel extending in the X direction (the direction indicated by the arrow in the Y direction is the right direction). Assuming that the first block is not provided, the difference of heights between the parts of the second electrode of the second color sub-pixel at two sides of the central line of the second electrode will be large, and the symmetry of the second electrode is not good, which will easily lead to color shift in the Y direction. In the embodiment of the present disclosure, by arranging the first block between the first sub-connecting portion and the first power signal line so that the overlapping position between the second connecting portion and the second electrode of the second color sub-pixel is located in the intermediate region of the effective light emitting region of the second color sub-pixel, the difference of heights between the intermediate region and the two side regions of the second electrode of the second color sub-pixel can be reduced, and the symmetry can be improved, which is beneficial to ensuring that the luminous intensities of the effective light emitting region in all directions are consistent, so as to alleviate color shift.

For example, as shown in FIGS. 3A-5C, the shape of the second connecting portion 520 in the second color sub-pixel 200 is L-shaped, and in the X direction, the size of the first sub-connecting portion 521 is greater than the size of the first block 522. For example, the second electrode 220 of the second color sub-pixel 200 includes a main body electrode 221 and a connecting electrode 222 which are connected with each other. The shapes of the main body electrode 221 and the effective light emitting region 201 are the same, and for example, are hexagons or ovals. For example, the orthographic projection of the effective light emitting region 201 of the second color sub-pixel on the base substrate is located within the orthographic projection of the main body electrode on the base substrate. For example, in the direction perpendicular to the base substrate, a part of the first sub-connecting portion is overlapped with the main body electrode 221, another part of the first sub-connecting portion 521 is overlapped with the connecting electrode 222 and connected with the connecting electrode 222 through the via hole 3010 in the planarization layer, and the first block 522 is only overlapped with the main body electrode 221 and not overlapped with the connecting electrode 222. For example, the via hole 3010 (e.g., the first via hole 3011 described later) is farther away from the effective light emitting region 201 of the second color sub-pixel 200 than the first block 522. For example, more than 90% of the orthographic projection of the second connecting portion 520 of the second color sub-pixel 200 on the base substrate falls within the orthographic projection of the second electrode 220 on the base substrate. In the embodiment of the present disclosure, the first block can be only arranged at the position where the second electrode of the first color sub-pixel is located, so as to cooperate with the first sub-connecting portion to improve the evenness and symmetry of the second electrode. The embodiment of the present disclosure illustratively shows that the first block is not arranged at any position other than the position where the second electrode is located, but is not limited thereto, and the shape of the second connecting portion in the second color sub-pixel can also be designed according to the process conditions and the actual requirements of products.

For example, as shown in FIGS. 3A-5C, in the third direction, the effective light emitting region 201 of the second color sub-pixel 200 is overlapped with the third connecting portion 530, and a straight line passing through the geometric center of the effective light emitting region 201 and extending in the X direction is overlapped with the third connecting portion 530. For example, the connecting electrode 222 is located at one side of a straight line passing through the geometric center of the effective light emitting region 201 and extending in the Y direction away from the third connecting portion 530. For example, the third connecting portion 530 is basically located in the intermediate region of the effective light emitting region 201 of the second color sub-pixel 200. For example, the second connecting portion 520 and the third connecting portion 530 are respectively located at both sides of a straight line extending in the Y direction and passing through the center of the effective light emitting region 201 of the second color sub-pixel 200, that is, the second connecting portion 520 and the third connecting portion 530 are respectively located at both sides of the central line of the effective light emitting region 201 of the second color sub-pixel 200 extending in the Y direction. For example, the second connecting portion 520 is located at one side of the straight line passing through the center of the effective light emitting region 201 of the second color sub-pixel 200 and extending in the Y direction, and at least part of the third connecting portion 530 is located at the other side of the straight line. With respect to the data line and the power signal line which are distributed at both sides of the effective light emitting region, in the embodiment of the present disclosure, an area of the source-drain metal layer covered by the intermediate region of the second electrode of the second color sub-pixel is less, and by setting the first block, and setting the overlapping part between the third connecting portion and the second connecting portion including the first block, and the effective light emitting region of the second color sub-pixel in the intermediate region of the effective light emitting region, the difference of heights between the intermediate region and the two side regions of the second electrode in the effective light emitting region can be reduced, and the evenness can be improved, thus alleviating color shift.

For example, as shown in FIGS. 3A-5C, the plurality of data lines 420 further include a plurality of second data lines 422, the plurality of second data lines and the plurality of first data lines 421 are alternately arranged on the same layer. The plurality of power signal lines 460 further include a plurality of second power signal lines 462, and the plurality of second power signal lines 462 and the plurality of first power signal lines 461 are alternately arranged on the same layer. For example, in the third direction, the second electrode 220 of each second color sub-pixel 200 is overlapped with the first data line 421, the first power signal line 461, the second connecting portion 520, the second data line 422 and the second power signal line 462; and for overlapping parts, the overlapping part of the second power signal line 462 is located at one side of the overlapping part of the first data line 421 away from the overlapping part of the second connecting portion 520, and the overlapping part of the second data line 422 is located at one side of the overlapping part of the first power signal line 461 away from the overlapping part of the second connecting portion 520. That is, the second electrode 220 of the second color sub-pixel 200 is overlapped with two data lines 420 and two power signal lines 460, the first data line 421 and the second power signal line 462 are arranged at one side of the second connecting portion 520, and the second data line 422 and the first power signal line 461 are arranged at the other side of the second connecting portion 520.

For example, as shown in FIGS. 3A-5C, the effective light emitting region 201 of each second color sub-pixel 200 is overlapped with the first data line 421, the first power signal line 461, the second data line 422 and the second power signal line 462, and for overlapping parts, the ratio of a sum of overlapping areas of the first power signal line 461 and the second data line 422 with the effective light emitting region 201 to a sum of overlapping areas of the second power signal line 462 and the first data line 421 with the effective light emitting region 201 is in the range from 0.8 to 1.2, and for example, 0.9-1.1. In the embodiment of the present disclosure, two side regions of the effective light emitting region of the second color sub-pixel are overlapped with the data line and the power signal line, and the overlapping areas of two parts of the source-drain metal layer located at both sides of the second connecting portion of the second color sub-pixel with the effective light emitting region are approximately the same, thus ensuring that the overlapping parts of the effective light emitting region and the source-drain metal layer of the second color sub-pixel have a good symmetry, which is beneficial to avoid color shift.

For example, as shown in FIGS. 3A-5C, the first data line 421 which is overlapped with the second electrode 220 of the second color sub-pixel 200 is electrically connected with the second electrode of the data writing transistor T4 of the first pixel block 110, and the second power signal line 462 which is overlapped with the second electrode 220 of the second color sub-pixel 200 is electrically connected with the first electrode of the second light emitting control transistor T5 of the first pixel block 110. For example, the first data line 421 and the second power signal line 420 which are overlapped with the second electrode 220 of the second color sub-pixel 200 are both overlapped with the second electrode 112 of the first pixel block 110. For example, the second electrode 112 of the first pixel block 110 has two overlapping parts with the first data line 421 and the second power signal line 462, and the two overlapping parts are located at both sides of a straight line which divides the effective light emitting region of the first pixel block 110 into two parts with equal area and extends in the first direction. Therefore, the second electrode of the first pixel block has good symmetry and evenness in the Y direction, which is beneficial to avoid the occurrence of color shift.

For example, as shown in FIGS. 3A-5C, the first power signal line 461 which is overlapped with the second electrode 220 of the second color sub-pixel 200 is electrically connected with the first electrode of the second light emitting control transistor T5 of the second color sub-pixel 200, and the second data line 422 which is overlapped with the second electrode 220 of the second color sub-pixel 200 is electrically connected with the second electrode of the data writing transistor T4 of the second color sub-pixel. For example, the second electrode 122 of the second pixel block 120 has two overlapping parts with the second data line 422 and the first power signal line 461, and the two overlapping parts are located at both sides of a straight line passing through the center of the second effective light emitting region 201 of the second pixel block 120 and extending in the X direction. Therefore, the second electrode of the second pixel block has good symmetry and evenness in the Y direction, which is beneficial to avoid the occurrence of color shift.

For example, as shown in FIGS. 3A-5C, in the direction perpendicular to the base substrate, one side edge of the main body electrode 1221 of the second pixel block 120 away from the auxiliary electrode 1223 is overlapped with the first connecting portion 510 of the second color sub-pixel 200.

For example, as shown in FIGS. 3A-5C, in the direction perpendicular to the base substrate, the second electrode 320 of each third color sub-pixel 300 is overlapped with the first data line 421, the first power signal line 461, the second data line 422 and the second power signal line 462. For example, in the direction perpendicular to the base substrate, the effective light emitting region 301 of each third color sub-pixel 300 is overlapped with the first data line 421, the first power signal line 461, the second data line 422 and the second power signal line 462. For example, the first data line 421 and the second power signal line 462 are located at one side of a central line of the effective light emitting region 301 of the third color sub-pixel 300 extending in the X direction, and the second data line 422 and the first power signal line 461 are located at the other side of the central line. For example, in the direction perpendicular to the base substrate, for overlapping parts of the second electrode 320 of each third color sub-pixel 300 with the first data line 421, the first power signal line 461, the second data line 422 and the second power signal line 462, the ratio of a sum of overlapping areas of the first power signal line 461 and the second data line 442 with the effective light emitting region 301 to a sum of overlapping areas of the second power signal line 462 and the first data line 421 with the effective light emitting region 301 is in the range from 0.8 to 1.2, and for example, 0.9-1.1. Therefore, parts of the second electrode 320 of the third color sub-pixel 300 located in two side regions (regions where the data line and the power signal line are overlapped with the second electrode) are overlapped with the source-drain metal layer, and the overlapping parts are approximately symmetrically distributed, which is beneficial to alleviating color shift.

For example, the second electrode 320 and the effective light emitting region 301 of the third color sub-pixel 300 are overlapped with the second connecting portion 520; and for overlapping parts of the first data line 421, the first power signal line 461 and the second connecting portion 520 with the second electrode 320, the overlapping part of the first power signal line 461 and the overlapping part of the first data line 421 are located at both sides of the overlapping part of the second connecting portion 520, and a ratio of a minimum distance between edges of the second connecting portion 520 and the first power signal line 461 which are close to each other to a minimum distance between edges of the second connecting portion 520 and the first data line 421 which are close to each other is not greater than 2.5, and for example, not greater than 2. For example, a straight line passing through the center of the effective light emitting region 301 of the third color sub-pixel 300 and extending in the X direction is overlapped with the second connecting portion 520. In the embodiment of the present disclosure, by arranging the second connecting portion of the third color sub-pixel in the intermediate region of the effective light emitting region, the difference of heights of the second electrode in the intermediate region and the two side regions (regions where the data line and the power signal line overlap with the effective light emitting region) of the effective light emitting region can be reduced, which is beneficial to alleviating color shift.

For example, as shown in FIGS. 3A-5C, the second connecting portion 520 of the third color sub-pixel 300 includes a second sub-connecting portion 523 and a second block 524 which are connected with each other, and the second block 524 is located at one side of the second sub-connecting portion 523 close to the center of the effective light emitting region 301 of the third color sub-pixel 300. For example, in the direction perpendicular to the base substrate, the second block 524 is overlapped with the effective light emitting region 301, and the second sub-connecting portion 523 is not overlapped with the effective light emitting region 301. For example, the second sub-connecting portion and the second block are formed as an integrated structure. According to the embodiment of the present disclosure, the second connecting portion is divided into the second sub-connecting portion and the second block, which can clearly indicate the positional relationships between the second connecting portion, the second electrode of the third color sub-pixel and the effective light emitting region of the third color sub-pixel.

For example, as shown in FIGS. 3A-5C, the second electrode 320 of the third color sub-pixel 300 includes a main body electrode 321 and a connecting electrode 322 which are connected with each other. The shapes of the main body electrode 321 and the effective light emitting region 301 of the third color sub-pixel 300 are the same, and for example, are hexagons or ovals. For example, the orthographic projection of the effective light emitting region of the third color sub-pixel on the base substrate is located within the orthographic projection of the main body electrode on the base substrate. For example, in the direction perpendicular to the base substrate, the main body electrode 321 is overlapped with the second block 524, and the connecting electrode 322 is overlapped with the second sub-connecting portion 523 and connected with the second sub-connecting portion 523. For example, in the direction perpendicular to the base substrate, the main body electrode 321 is not overlapped with the second sub-connecting portion 523 substantially.

For example, as shown in FIGS. 3A-5C, in the direction perpendicular to the base substrate, the first connecting portion 510 of the third color sub-pixel 300 is overlapped with the effective light emitting region 301, and at least part of the first connecting portion 510 and the second block 524 of the third color sub-pixel 300 are located at both sides of a fourth straight line passing through the center of the effective light emitting region 301 and extending in the Y direction, respectively. In the embodiment of the present disclosure, the effective light emitting region and the second electrode of the third color sub-pixel are overlapped with the first connecting portion. By arranging the second block at the edge of the effective light emitting region away from the first connecting portion, the height difference of the intermediate region of the second electrode of the third color sub-pixel in the X direction can be reduced, which is beneficial to alleviating color shift of the third color sub-pixel.

For example, as shown in FIGS. 3A-5C, the shape of the second sub-connecting portion 523 in the second connecting portion 520 of the third color sub-pixel 300 is a rectangle, and one side of the second sub-connecting portion 523 close to the first power signal line 461 is connected with the second electrode 320 through the via hole 3010 in the planarization layer, and one side of the second sub-connecting portion 523 close to the first data line 421 is connected with the second electrode of the first light emitting control transistor T6 through the via hole 3008 penetrating through the gate insulating layer, the first insulating layer and the second insulating layer. The rectangular shapes in the embodiments of the present disclosure include standard rectangular shapes and approximate rectangular shapes, and for example, the approximate rectangular shapes can include a shape with an overall outline of an approximate rectangle, such as a rectangle with rounded angles.

For example, as shown in FIGS. 3A-5C, the shape of the second block 524 in the second connecting portion 520 of the third color sub-pixel 300 is a rectangle, and two sides of the second block 524 extending in the X direction are respectively flush with two sides of the second sub-connecting portion 523 extending in the X direction, so that the shape of the second connecting portion of the third color sub-pixel is a rectangle. In the embodiment of the present disclosure, the second block is added to reduce the height difference of the intermediate region of the second electrode of the third color sub-pixel in the X direction and the height difference of the second electrode in the Y direction, and at the same time, the shape of the second connecting portion is set to be a rectangle, which is convenient to be manufactured.

Figure 7:
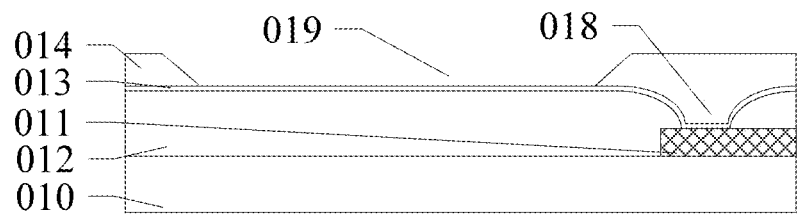
FIG. 7 is a schematic diagram of a partial cross-sectional structure of another display substrate.

FIG. 7 is a schematic diagram of a partial cross-sectional structure of another display substrate. The display substrate shown in FIG. 7 includes the film layer 010, the source-drain metal layer 011, the planarization layer 012, the anode 013 and the pixel defining layer 014 shown in FIG. 6. As shown in FIG. 7, the planarization layer 012 in the display substrate includes a via hole 018 so that the anode 013 can be electrically connected with the source-drain metal layer 011. The pixel defining layer 014 includes an opening 019 to expose part of the anode 013, and when an organic light emitting layer is subsequently formed in the opening 019, the organic light emitting layer is contacted with the anode 013 to form an effective light emitting region.

As shown in FIG. 7, the via hole 018 is located at an outer side of the effective light emitting region. Because the anode 013 located around the via hole 018 is tilted, a certain distance should be set between the effective light emitting region and the via hole 018, which can ensure the evenness of the anode 013 in the effective light emitting region, thus avoiding the occurrence of color shift phenomenon of the display substrate.

Figure 8:
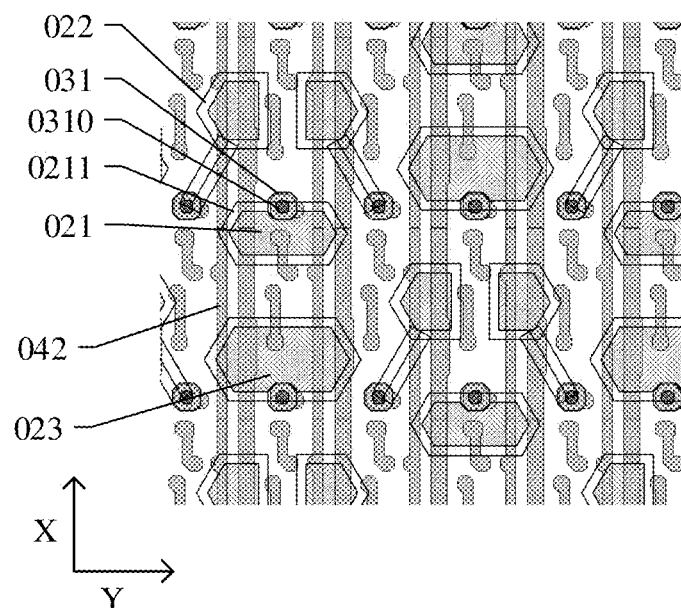
FIG. 8 is a schematic diagram of a pixel arrangement structure in a display substrate.

FIG. 8 is a schematic diagram of a pixel arrangement structure in a display substrate. As shown in FIG. 8, the display substrate includes a data line 042 extending in the X direction, and the display substrate further includes a red sub-pixel 021, a green sub-pixel pair 022, and a blue sub-pixel 023. The effective light emitting regions of the red sub-pixel 021 and the blue sub-pixel 023 extend in the Y direction. For example, each sub-pixel includes a light emitting element and a pixel circuit that drives the light emitting element to emit light, the light emitting element includes an anode, a light emitting layer and a cathode that are sequentially stacked in the direction away from the base substrate, and the anode is connected with a connecting portion 031 through a via hole 0310 to realize connection with a thin film transistor in the pixel circuit. For example, the via holes 0310 corresponding to the red sub-pixel 021, the green sub-pixel pair 022, and the blue sub-pixel 023 are aligned in a straight line along the Y direction. For example, the anode 0211 of the red sub-pixel 021 is connected with the connecting portion 031 through the via hole 0310, and a long side of the effective light emitting region 0211 of the red sub-pixel 021 close to the via hole 0310 is provided with a notch to avoid the via hole 0310, and a proper distance (preset distance), for example, 3 microns, between the effective light emitting region 0211 and the via hole 0310 is ensured. Similarly, a long side of the effective light emitting region of the blue sub-pixel 023 close to the via hole 0310 also needs to be provided with a notch to avoid the via hole 0310, and the preset distance between the effective light emitting region and the via hole 0310 is ensured. The preset distance refers to a minimum distance (e.g., 3 microns) between the edge of the effective light emitting region and the edge of the via hole, so as to ensure that the via hole will not affect the light emitting direction of the edge of the effective light emitting region.

For example, the minimum distance between the edge of the third via hole of the first pixel block and the edge of the effective light emitting region of the second color sub-pixel and the minimum distance between the edge of the third via hole of the first pixel block and the edge of the effective light emitting region of the first color sub-pixel are approximately the same, and both are greater than 3 microns. For example, the minimum distance between the edge of the fourth via hole of the second pixel block and the edge of the effective light emitting region of the second color sub-pixel and the minimum distance between the edge of the fourth via hole of the second pixel block and the edge of the effective light emitting region of the first color sub-pixel are approximately the same, and both are greater than 3 microns.

For example, the orthographic projection of the second electrode of the second color sub-pixel on the base substrate is overlapped with the orthographic projection of the reset power signal line on the base substrate.

In another example of the embodiment of the present disclosure, as shown in FIGS. 4-5F, the second electrode 220 of the second color sub-pixel 200 is connected with the second connecting portion 520 through the first via hole 3011 penetrating through the planarization layer, and the second electrode 320 of the third color sub-pixel 300 is connected with the second connecting portion 520 through the second via hole 3012 penetrating through the planarization layer. The minimum distance between the orthographic projection of the effective light emitting region 201 of the second color sub-pixel 200 on a straight line along the X direction (the extending direction of the data line 420) and the orthographic projection of the effective light emitting region 301 of the third color sub-pixel 300 on the straight line is less than the size sum of the orthographic projections of the first via hole and the preset distance between the edge of the first via hole and the edge of the effective light emitting region on the straight line. The first via hole 3011 is located at one side of the effective light emitting region 201 of the second color sub-pixel 200 close to the effective light emitting region 301 of the third color sub-pixel 300 in the X direction, the second via hole 3012 is located at one side of the effective light emitting region 301 of the third color sub-pixel 300 close to the effective light emitting region 201 of the second color sub-pixel 200 in the X direction, and a first connecting line 3101 connecting the first via hole 3011 with the second via hole 3012 is not parallel to the Y direction. For example, the orthographic projections of the first via hole 3011, the fourth via hole 3014 and the third via hole 3013 on the base substrate are overlapped with the orthographic projection of the light emitting control signal line 450 on the base substrate. For example, the orthographic projection of the second via hole 3012 on the base substrate is not overlapped with the orthographic projection of the light emitting control signal line 450 on the base substrate. The first connecting line described above is a straight line.

For example, the first connecting line 3101 connecting the first via hole 3011 with the second via hole 3012 can refer to a connecting line connecting the center of the first via hole and the center of the second via hole; it can also refer to a connecting line connecting the point of the first via hole closest to the effective light emitting region of the second color sub-pixel and the point of the second via hole farthest from the effective light emitting region of the third color sub-pixel; and it can also refer to a connecting line connecting the point of the first via hole farthest from the effective light emitting region of the second color sub-pixel and the point of the second via hole closest to the effective light emitting region of the third color sub-pixel.

For example, the second electrode of the second color sub-pixel is not overlapped with the second electrode of the third color sub-pixel in the second direction.

In the embodiment of the present disclosure, the distance between the effective light emitting region of the second color sub-pixel and the effective light emitting region of the third color sub-pixel in the X direction is relatively small, for example, less than the size sum of the first via hole and the preset distance. Therefore, assuming that a first via hole is arranged within the spacing between the effective light emitting region of the second color sub-pixel and the effective light emitting region of the third color sub-pixel in the X direction, the position of the first via hole and the position of the effective light emitting region of the second color sub-pixel will collide, which will affect the illumination of the second color sub-pixel. In the embodiment of the present disclosure, the position of the via hole (e.g., at least one of the first via hole and the second via hole) in the planarization layer is adjusted according to the positions of the effective light emitting regions of the second color sub-pixel and the third color sub-pixel. For example, the connecting lines of the first via hole and second via hole corresponding to the second color sub-pixel and the third color sub-pixel are not parallel to the extending direction of the scan signal line, which can ensure the evenness of the second electrodes of the second color sub-pixel and the third color sub-pixel, so as to ensure the consistency of luminous intensity of the effective light emitting regions in all directions and effectively alleviate color shift.

For example, as shown in FIGS. 4-5C, the included angle between the first connecting line 3101 and the Y direction is in the range from 5 degrees to 15 degrees. According to the embodiment of the present disclosure, by adjusting the positions of the first via hole and the second via hole, the probability of color shift occurred in the second color sub-pixel and the third color sub-pixel can be reduced.

For example, as shown in FIGS. 4-5C, the second via hole 3012 is located at one side of a second straight line 3102 passing through the first via hole 3011 and extending in the Y direction close to the effective light emitting region 201 of the second color sub-pixel 200. For example, the orthographic projection of the first via hole 3011 on a straight line extending in the X direction is not overlapped with the orthographic projection of the second via hole 3012 on the straight line. In the embodiment of the present disclosure, the distance between the effective light emitting region of the second color sub-pixel and the first via hole and the distance between the effective light emitting region of the third color sub-pixel and the second via hole are set to be relatively large, which can ensure that the via holes do not affect the evenness of the second electrode located in the effective light emitting region, thus ensuring that the effective light emitting regions have consistent luminous intensity in all directions and effectively alleviating color shift.

For example, as shown in FIGS. 4-5C, in the second color sub-pixel 200, the second connecting portion 520 is electrically connected with the second electrode of the first light emitting control transistor T6 through the first connecting hole 3021 penetrating through the gate insulating layer, the first insulating layer and the second insulating layer; in the third color sub-pixel 300, the second connecting portion 520 is electrically connected with the second electrode of the first light emitting control transistor T6 through the second connecting hole 3022 penetrating through the gate insulating layer, the first insulating layer and the second insulating layer, and the second connecting line 3200 connecting the first connecting hole 3021 with the second connecting hole 3022 is parallel to the Y direction. For example, the second connecting line 3200 connecting the first connecting hole 3021 with the second connecting hole 3022 can refer to a connecting line connecting the center of the first connecting hole and the center of the second connecting hole; it can also refer to a connecting line connecting the point of the first connecting hole closest to the effective light emitting region of the second color sub-pixel and the point of the second connecting hole farthest from the effective light emitting region of the third color sub-pixel; and it can also refer to a connecting line connecting the point of the first connecting hole farthest from the effective light emitting region of the second color sub-pixel and the point of the second connecting hole closest to the effective light emitting region of the third color sub-pixel.

For example, as shown in FIGS. 4-5C, the effective light emitting region 201 of the second color sub-pixel 200 includes a first long side 1011 and a second long side 1012 extending in the Y direction, the second long side 1012 is located at one side of the first long side 1011 away from the first via hole 3011, and in the third direction perpendicular to the base substrate, an extension line of the first long side 1011 is overlapped with the second via hole 3012. For example, the orthographic projection of the second via hole 3012 on a straight line extending in the X direction is overlapped with the orthographic projection of the second connecting hole 3022 on the straight line. In the embodiment of the present disclosure, when adjusting the position of the second via hole, the position of the second connecting hole is taken into consideration, and the position of the second via hole penetrating through the planarization layer is not greatly adjusted in the X direction with the position of the second connecting hole penetrating through the gate insulating layer, the first insulating layer and the second insulating layer, thereby reducing the influence on the overall structure of the pixel circuit.

For example, as shown in FIGS. 4-5C, the effective light emitting region 301 of the third color sub-pixel 300 includes a third long side 1013 and a fourth long side 1014 extending in the Y direction, the fourth long side 1014 is located at one side of the third long side 1013 away from the second via hole 3012, and in the direction perpendicular to the base substrate, an extension line of the fourth long side 1014 is overlapped with the first via hole 3011. For example, in the direction perpendicular to the base substrate, the first connecting hole 3021 is overlapped with the effective light emitting region 201 of the second color sub-pixel 200, the first via hole 3011 is farther away from the effective light emitting region 201 of the second color sub-pixel 200 than the first connecting hole 3021, and the orthographic projection of the first via hole 3011 on a straight line extending in the X direction is not overlapped with the orthographic projection of the first connecting hole 3021 on the straight line. In the embodiment of the present disclosure, when adjusting the position of the first via hole, it is necessary to consider that the position of the first via hole penetrating through the planarization layer is slightly adjusted in the X direction with the position of the first connecting hole penetrating through the gate insulating layer, the first insulating layer and the second insulating layer, and to maintain the distance between the first via hole and the effective light emitting region of the second color sub-pixel, so as to avoid affecting the consistency of luminous intensity of the effective light emitting region in all directions.

For example, as shown in FIGS. 4-5C, a shortest distance between the orthographic projections of the first long side 1011 of the effective light emitting region 201 of the second color sub-pixel 200 and the first via hole 3011 on the base substrate is a first distance, a shortest distance between the orthographic projections of the third long side 1013 of the effective light emitting region 301 of the third color sub-pixel 300 and the second via hole 3012 on the base substrate is a second distance, and the ratio of the first distance to the second distance is in the range from 0.8 to 1.2, and for example, 0.9-1.1. For example, the first distance and the second distance are completely equal. For example, both the first distance and the second distance are greater than 3 microns. The above-mentioned "shortest distance between the orthographic projections of the first long side 1011 and the first via 3011 on the base substrate" refers to a distance between the point of the orthographic projection of the first via hole closest to the orthographic projection of the first long side and the orthographic projection of the first long side. The above-mentioned "shortest distance between the orthographic projections of the third long side 1013 and the second via hole 3012 on the base substrate" refers to a distance between the point of the orthographic projection of the second via hole closest to the orthographic projection of the third long side and the orthographic projection of the third long side. In the embodiment of the present disclosure, by setting the distance between the via hole in the planarization layer and the edge of the effective light emitting region of the sub-pixel to be relatively large, it can prevent the via hole from affecting the evenness of the second electrode in the effective light emitting region, thereby ensuring the consistency of luminous intensity in all directions and effectively alleviating color shift.

For example, as shown in FIGS. 4-5C, the first long side 1011 of the effective light emitting region 201 of the second color sub-pixel 200 is a straight side, and the third long side 1013 of the effective light emitting region 301 of the third color sub-pixel 300 is a straight side. In the embodiment of the present disclosure, by adjusting the positions of the first via hole and the second via hole, it is ensured that the positions of the via holes do not affect the effective light emitting regions, and at the same time, the edge of the effective light emitting region can be prevented from being designed to have a notch shape in order to dodge the via hole, thus avoiding the design of an irregular opening in the pixel defining layer and reducing the problems in the manufacturing process.

For example, as shown in FIGS. 4-5C, the second electrode 112 of the first pixel block 110 in the first color sub-pixel pair 100 is connected with the second connecting portion 520 through the third via hole 3013 penetrating through the planarization layer, the second electrode 122 of the second pixel block 120 in the first color sub-pixel pair 100 is connected with the second connecting portion 520 through the fourth via hole 3014 penetrating through the planarization layer, and the first connecting line 3103 connecting the third via hole 3013 with the fourth via hole 3010 is substantially parallel to the Y direction. According to the embodiment of the disclosure, the third via hole and the fourth via hole are arranged on a straight line extending in the Y direction, so that the distance between the via hole and the corresponding effective light emitting region is ensured, and it can be conveniently manufactured at the same time.

For example, the first connecting line 3103 connecting the third via hole 3013 with the fourth via hole 3014 can refer to a connecting line between the center of the third via hole and the center of the fourth via hole; it can also refer to a connecting line between the point of the third via hole closest to the first effective light emitting region and the point of the fourth via hole closest to the second effective light emitting region; and it can also refer to a connecting line between the point of the third via hole farthest away from the first effective light emitting region and the point of the fourth via hole farthest away from the second effective light emitting region.

For example, as shown in FIGS. 4-5C, a straight line where the first connecting line 3103 is located passes through the first via hole 3011 and does not pass through the second via hole 3012. In the embodiment of the present disclosure, the first via hole connected with the second electrode of the second color sub-pixel, the third via hole and the fourth via hole connected with the second electrodes of the first color sub-pixel pair, are substantially located on a straight line parallel to the scan signal line, which ensures that the distance between the first via hole and the corresponding effective light emitting region is greater than 3 microns, and is also convenient to be manufactured.

For example, as shown in FIGS. 4-5C, in the third direction perpendicular to the base substrate, a straight line of the third long side 1013 of the effective light emitting region 301 of the second color sub-pixel 300 is overlapped with both the third via hole 3013 and the fourth via hole 3014.

For example, as shown in FIGS. 4-5C, in the Y direction, the third via hole 3013 or the fourth via hole 3014 is disposed between the first via hole 3011 and the second via hole 3012. That is, the third via hole and the fourth via hole are disposed at both sides of the first via hole in the Y direction, or the third via hole and the fourth via hole are disposed at both sides of the second via hole in the Y direction.

For example, as shown in FIGS. 4-5C, in the first sub-pixel block 110, the second connecting portion 520 is electrically connected with the second electrode of the first light emitting control transistor T6 through the third connecting hole 3023 penetrating through the gate insulating layer, the first insulating layer and the second insulating layer; in the second sub-pixel block 120, the second connecting portion 520 is electrically connected with the second electrode of the first light emitting control transistor T6 through the fourth connecting hole 3024 penetrating through the gate insulating layer, the first insulating layer and the second insulating layer, and the fourth connecting line 3400 connecting the third connecting hole 3023 with the fourth connecting hole 3024 basically coincides with the second connecting line 3200.

For example, the fourth connecting line 3400 connecting the third connecting hole 3023 with the fourth connecting hole 3024 can refer to a connecting line between the center of the third connecting hole and the center of the fourth connecting hole; it can also refer to a connecting line between the point of the third connecting hole closest to the first effective light emitting region and the point of the fourth connecting hole closest to the second effective light emitting region; and it can also refer to a connecting line between the point of the third connecting hole farthest away from the first effective light emitting region and the point of the fourth connecting hole farthest away from the second effective light emitting region.

It should be noted that in the embodiments of the present disclosure, the first direction indicates the extending direction of the data line and the second direction indicates the extending direction of the scan signal line, and the names of the two directions can be interchanged. In the embodiments of the present disclosure, the first connecting portion indicates a connecting portion connecting the second electrode of the threshold compensation transistor with the gate electrode of the driving transistor, the second connecting portion indicates a connecting portion connecting the second electrode of the first light emitting control transistor with the second electrode of the light emitting element, and the third connecting portion indicates a connecting portion connecting the first electrode of the first reset transistor with the reset power signal line. The names of the above three connecting portions can be interchanged.

As illustrated in FIG. 3A to FIG. 5J, the display substrate includes a base substrate 1 and a plurality of sub-pixels 10 on the base substrate 1. Each of the plurality of sub-pixels 10 includes a light emitting element 11 and a pixel circuit 12, the light emitting element 11 includes a first electrode, a light emitting layer and a second electrode which are stacked in sequence, the second electrode is between the light emitting layer and the base substrate 1, the pixel circuit includes a driving transistor T3 and a storage capacitor C which are between the second electrode of the light emitting element 11 and the base substrate 1, a gate electrode of the driving transistor T3 is also used as an electrode of the storage capacitor C. The plurality of sub-pixels 10 include at least one first color sub-pixel pair 100 and a plurality of sub-pixels of other colors, each first color sub-pixel pair 100 includes a first pixel block 110 and a second pixel block 120, a minimum distance between the first pixel block 110 and the second pixel block 120 in each first color sub-pixel pair 100 is not greater than a minimum distance between two sub-pixels of a same color in the plurality of sub-pixels of other colors; in a same first color sub-pixel pair 100, an overlapping situation, of orthographic projections of the second electrode of the light emitting element 11 of one first pixel block 110 and the gate electrode of the driving transistor T3 of the one first pixel block 110 on the base substrate 1, is the same as an overlapping situation, of orthographic projections of the second electrode of the light emitting element 11 of one second pixel block 120 and the gate electrode of the driving transistor T3 of the one second pixel block 120 on the base substrate 1, gate nodes of the driving transistors in two first color sub-pixels can have balanced coverage, which is beneficial to balancing the electrical environment and luminous effect of the two first color sub-pixels.

The above-mentioned "overlapping situation of orthographic projections" includes a situation that the orthographic projection of the second electrode of the light-emitting element overlaps or does not overlap with the orthographic projection of the gate electrode of the driving transistor. The above-mentioned two "overlapping situations of orthographic projection" are the same can mean that, in the first pixel block, an orthographic projection of the second electrode of the light-emitting element overlaps with an orthographic projection of the gate electrode of the driving transistor, and in the second pixel block, an orthographic projection of the second electrode of the light-emitting element overlaps with an orthographic projection of the gate electrode of the driving transistor, or mean that, in the first pixel block, an orthographic projection of the second electrode of the light-emitting element does not overlap with an orthographic projection of the gate electrode of the driving transistor, and in the second pixel block, an orthographic projection of the second electrode of the light-emitting element does not overlap with an orthographic projection of the gate electrode of the driving transistor.

For example, as illustrated in FIG. 3A to FIG. 5J, the first pixel block 110 and the second pixel block 120 included in the same first color sub-pixel pair 100 are arranged along a row direction, and the plurality of sub-pixels of other colors include second color sub-pixels 200 and third color sub-pixels 300, and at least one kind of the second color sub-pixels 200 and the third color sub-pixels 300 is located in an adjacent row with the first color sub-pixel pair 100; the display substrate further includes a planarization layer 6, between the pixel circuit 12 and the second electrode of the light emitting element 11, the planarization layer 6 includes a plurality of via holes 3010 penetrating therethrough, and in each of the plurality of sub-pixels, the second electrode of the light emitting element 11 is electrically connected with a corresponding pixel circuit 12 through the via hole 3010, the via holes 3010 corresponding to sub-pixels 100 located in different rows of two adjacent rows of the plurality of sub-pixels 100 are not on a straight line, and an orthographic projection of a via hole 3010 corresponding to one of two sub-pixels 10 respectively located in the two adjacent rows on a straight line extending in a column direction is overlapped with an orthographic projection of an effective light emitting region of the other of the two sub-pixels on the straight line. By setting the via hole positions of adjacent rows of sub-pixels, it can be avoided that the via hole corresponding to a sub-pixel overlaps with its effective light-emitting region, which affects the flatness of the second electrode of the sub-pixel and further affects the light-emitting direction.

For example, as illustrated in FIG. 3A to FIG. 5J, in a direction perpendicular to the base substrate 1, the second electrode of the light emitting element of at least one of the third color sub-pixels 300 is overlapped with two data lines 420 and two power signal lines 460, it is beneficial to improve the flatness of the second electrode of the third color sub-pixel.

For example, as illustrated in FIG. 3A to FIG. 5J, in the direction perpendicular to the base substrate 1, an effective light emitting region of the light emitting element of the at least one of the third color sub-pixels 300 is overlapped with two data lines 300, it is beneficial to reduce the probability of color cast of the third color sub-pixel.

For example, as illustrated in FIG. 3A to FIG. 5J, in a direction perpendicular to the base substrate 1, the second electrode of the light emitting element of at least one of the second color sub-pixels 200 is overlapped with two data lines 420, it is beneficial to improve the flatness of the second electrode of the second color sub-pixel.

For example, as illustrated in FIG. 3A to FIG. 5J, the plurality of sub-pixels 10 include a plurality first color sub-pixel pairs 100 arranged in a second direction, the plurality of first color sub-pixel pairs 100 include first pixel blocks 110 and second pixel blocks 120 alternately arranged in the second direction, two distances between an effective light emitting region of one first pixel block 110 and effective light emitting regions of two second pixel blocks 120 located on both sides of the effective light emitting region of the one first pixel block in the second direction are different; and the display substrate further includes a data line 420 extending in a first direction, an included angle between the second direction and the first direction is in a range from 80 degrees to 100 degrees.

For example, as illustrated in FIG. 3A to FIG. 5J, pixel circuits of the plurality of sub-pixels include pixel circuit rows arranged in a column direction, each pixel circuit row includes pixel circuits arranged in a row direction, and centers of effective light emitting regions of some second color sub-pixels 200 and some third color sub-pixels 300 connected with pixel circuits in a same pixel circuit row are not in a straight line. By making the two distances between the effective light-emitting region of the first pixel block and the effective light-emitting regions of two second pixel blocks located on both sides of the effective light-emitting region of the first pixel block in the second direction different, and the centers of the effective light-emitting regions of some second color sub-pixels and some third color sub-pixels connected with pixel circuits in the same pixel circuit row are not in a straight line, it is beneficial to improve the uniformity of sub-pixel light emission in the display substrate.

For example, as illustrated in FIG. 3A to FIG. 5J, the pixel circuit further includes a threshold compensation transistor T2, a first electrode of the threshold compensation transistor T2 is electrically connected with a first electrode of the driving transistor T3, and a second electrode of the threshold compensation transistor T2 is electrically connected with a gate electrode of the driving transistor T3, the threshold compensation transistor T2 includes a first gate electrode T2-g1 and a second gate electrode T2-g2, the second electrode of the light emitting element 11 of the first pixel block 110 shields one of the first gate T2-g1 and the second gate T2-g2, it is beneficial to improve the voltage stability of threshold compensation transistor.

For example, as illustrated in FIG. 3A to FIG. 5J, the second electrode 320 of the light emitting element of each of the third color sub-pixels 300 includes a main body electrode 321 and a connecting electrode 322, the connecting electrode 322 is configured to electrically connected with the pixel circuit, in a direction perpendicular to the base substrate 1, an effective light emitting region of the third color sub-pixel 300 is overlapped with the main body electrode 321, and the main body electrode 321 of the third color sub-pixel 300 is overlapped with at least one of the first gate T2-g1 and the second gate T2-g2 of the threshold compensation transistor T2, it is beneficial to improve the voltage stability of threshold compensation transistor.

For example, as illustrated in FIG. 3A to FIG. 5J, the second electrode of the light emitting element of a sub-pixel of at least one color includes a main body electrode and a connecting electrode, the connecting electrode is configured to electrically connected with the pixel circuit, in the direction perpendicular to the base substrate 1, an effective light emitting region of the sub-pixel of at least one color is overlapped with the main body electrode; the second electrode of the light emitting element of the sub-pixel of at least one color further includes an auxiliary electrode, the auxiliary electrode covers a part of an active layer between orthographic projections of the first gate electrode T2-g1 and the second gate electrode T2-g2 of the threshold compensation transistor T2 on the active layer.

For example, as illustrated in FIG. 3A to FIG. 5J, the pixel circuit further includes a first light emitting control transistor T6, a first connecting portion 510 and a second connecting portion 520 which are between the second electrode of the light emitting element and the base substrate 1, a first electrode of the first light emitting control transistor T6 is electrically connected with the first electrode of the driving transistor T3, and a second electrode of the first light emitting control transistor T6 is electrically connected with the second electrode of the light emitting element through the second connecting portion 520, pixel circuits of the plurality of sub-pixels include pixel circuit rows arranged in a column direction, each pixel circuit row includes pixel circuits arranged in a row direction, two adjacent second connecting portions 520 in a same pixel circuit row have different shapes and sizes.

For example, as illustrated in FIG. 3A to FIG. 5J, the display substrate further includes a light emitting control signal line 450, extending in the row direction and arranged in the same layer as the gate electrode of the driving transistor T3. In a direction perpendicular to the base substrate 1, the second connecting portion 520 is overlapped with the light emitting control signal line 450 and is not overlapped with the gate electrode of the driving transistor T3, therefore, it can be avoided that the second connecting portion covers the gate of the driving transistor (i.e., one electrode of the storage capacitor) to increase the load.

For example, as illustrated in FIG. 3A to FIG. 5J, in the first color sub-pixel pair 100, the second electrode of the light emitting element of each sub-pixel includes a main body electrode and a connecting electrode, the connecting electrode is configured to electrically connected with the pixel circuit, in a direction perpendicular to the base substrate 1, an effective light emitting region 101 of the first pixel block 110 is overlapped with the main body electrode 1121, and an effective light emitting region 102 of the second pixel block 120 is overlapped with the main body electrode 1221; a part of the second electrode of the light emitting element of the first pixel block 110 except the main body electrode 1121 and a part of the second electrode of the light emitting element of the second pixel block 120 except the main body electrode 1121 have different shapes and sizes.

For example, as illustrated in FIG. 3A to FIG. 5J, parts, of second electrodes of the light emitting elements of the first pixel block 110 and the second pixel block 120, except main body electrodes and connecting electrodes are different in shape and size.

Another embodiment of the present disclosure provides a display device, which includes any one of the display substrates described above.

For example, the display device provided by the embodiment of the present disclosure can be an organic light emitting diode display device.

For example, in the display device provided by the embodiment of the present disclosure, in the two first color sub-pixels included in the first color sub-pixel pair (e.g., green sub-pixel pair), the ratio between the overlapping areas of the second electrodes of the two light emitting elements with the corresponding two first connecting portions is in the range from 0.8 to 1.2, and for example, 0.9-1.1, which can reduce the difference of loads of the gate nodes of the driving transistors in the two first color sub-pixels, thereby reducing the brightness difference between the two first color sub-pixels and improving the display characteristics of the display substrate.

For example, in the display device provided by the embodiment of the present disclosure, by setting an auxiliary electrode covering one of the two gate electrodes of the threshold compensation transistor in a green sub-pixel of a green color sub-pixel pair (i.e., first color sub-pixel pair), the external light can be prevented from being directly incident on the channel region of the threshold compensation transistor, and the characteristic deviation of the threshold compensation transistor caused by illumination when the display substrate displays can be avoided, thereby preventing the writing of the gate potential of the driving transistor from being affected.

For example, in the display device provided by the embodiment of the present disclosure, by setting the distance between the second connecting portion of the second color sub-pixel (e.g., red sub-pixel) and the adjacent data line and the distance between the second connecting portion of the second color sub-pixel and the adjacent power signal line to be approximately the same, the difference of heights between the intermediate region (the region not overlapped with the data line and the power signal line) and the two side regions (the regions overlapped with the data line and the power signal line) in the second electrode of the second color sub-pixel can be reduced, and the evenness of the second electrode of the second color sub-pixel can be improved, and color shift can be alleviated.

For example, in the display device provided by the embodiment of the present disclosure, the effective light emitting region and the second electrode of the third color sub-pixel (e.g., blue sub-pixel) are overlapped with the first connecting portion, and by arranging the second block at the edge of the effective light emitting region away from the first connecting portion, the height difference of the intermediate region of the second electrode of the third color sub-pixel in the extending direction of the scan signal line and in the extending direction of the data line can be reduced, which is beneficial to alleviating color shift of the third color sub-pixel.

For example, in the display device provided by the embodiment of the present disclosure, the position of the via hole (e.g., at least one of the first via hole and the second via hole) in the planarization layer is adjusted according to the positions of the effective light emitting regions of the second color sub-pixel and the third color sub-pixel. For example, the connecting lines of the first via hole and second via hole corresponding to the second color sub-pixel and the third color sub-pixel are not parallel to the extending direction of the scan signal line, which can ensure the evenness of the second electrodes of the second color sub-pixel and the third color sub-pixel, so as to ensure the consistency of luminous intensity of the effective light emitting regions in all directions and effectively alleviate color shift.

The following points need to be explained:

(1) In the drawings of the embodiments of the present disclosure, only the structures related to the embodiments of the present disclosure are involved, and other structures may refer to common designs.

(2) In case of no conflict, features in the same embodiment and different embodiments of the present disclosure may be combined with each other.

What are described above is related to the illustrative embodiments of the disclosure only and not limitative to the scope of the disclosure, the scopes of the disclosure are defined by the accompanying claims.

What is claimed is:
1. A display substrate, comprising:
a base substrate;
a plurality of sub-pixels on the base substrate, wherein each of the plurality of sub-pixels comprises a light emitting element and a pixel circuit, the light emitting element comprises a first electrode, a light emitting layer and a second electrode which are stacked in sequence, the second electrode is between the light emitting layer and the base substrate, the pixel circuit comprises a driving transistor and a storage capacitor which are between the second electrode of the light emitting element and the base substrate, a gate electrode of the driving transistor is also used as an electrode of the storage capacitor;

wherein the plurality of sub-pixels comprises at least one first color sub-pixel pair and a plurality of sub-pixels of other colors, each first color sub-pixel pair comprises a first pixel block and a second pixel block, a minimum distance between the first pixel block and the second pixel block in each first color sub-pixel pair is not greater than a minimum distance between two sub-pixels of a same color in the plurality of sub-pixels of other colors;

in a same first color sub-pixel pair, an overlapping situation, of orthographic projections of the second electrode of the light emitting element of one first pixel block and the gate electrode of the driving transistor of the one first pixel block on the base substrate, is the same as an overlapping situation, of orthographic projections of the second electrode of the light emitting element of one second pixel block and the gate electrode of the driving transistor of the one second pixel block on the base substrate.

2. The display substrate according to claim 1, wherein the first pixel block and the second pixel block included in the same first color sub-pixel pair are arranged along a row direction, and the plurality of sub-pixels of other colors comprises second color sub-pixels and third color sub-pixels, and at least one kind of the second color sub-pixels and the third color sub-pixels is located in an adjacent row with the first color sub-pixel pair;

the display substrate further comprises a planarization layer, between the pixel circuit and the second electrode of the light emitting element, the planarization layer comprises a plurality of via holes penetrating therethrough, and in each of the plurality of sub-pixels, the second electrode of the light emitting element is electrically connected with a corresponding pixel circuit through the via hole, the via holes corresponding to sub-pixels located in different rows of two adjacent rows of the plurality of sub-pixels are not on a straight line, and an orthographic projection of a via hole corresponding to one of two sub-pixels respectively located in the two adjacent rows on a straight line extending in a column direction is overlapped with an orthographic projection of an effective light emitting region of the other of the two sub-pixels on the straight line.

3. The display substrate according to claim 1, further comprising:

data lines, extending in a first direction;

power signal lines, extending in the first direction, wherein the plurality of sub-pixels of other colors comprises second color sub-pixels and third color sub-pixels, in a direction perpendicular to the base substrate, the second electrode of the light emitting element of at least one of the third color sub-pixels is overlapped with two data lines and two power signal lines.

4. The display substrate according to claim 3, wherein, in the direction perpendicular to the base substrate, an effective light emitting region of the light emitting element of the at least one of the third color sub-pixels is overlapped with two data lines.

5. The display substrate according to claim 3, wherein the plurality of sub-pixels comprises a plurality first color sub-pixel pairs arranged in a second direction, the plurality of first color sub-pixel pairs comprises first pixel blocks and second pixel blocks alternately arranged in the second direction, two distances between an effective light emitting region of one first pixel block and effective light emitting regions of two second pixel blocks located on both sides of the effective light emitting region of the one first pixel block in the second direction are different; and the display substrate further comprises a data line extending in a first direction, an included angle between the second direction and the first direction is in a range from 80 degrees to 100 degrees.

6. The display substrate according to claim 5, wherein the plurality of sub-pixels of other colors comprises second color sub-pixels and third color sub-pixels, pixel circuits of the plurality of sub-pixels comprise pixel circuit rows arranged in a column direction, each pixel circuit row comprises pixel circuits arranged in a row direction, and centers of effective light emitting regions of some second color sub-pixels and some third color sub-pixels connected with pixel circuits in a same pixel circuit row are not in a straight line.

7. The display substrate according to claim 1, further comprising:

data lines, extending in a first direction;

power signal lines, extending in the first direction, wherein the plurality of sub-pixels of other colors comprises second color sub-pixels and third color sub-pixels, in a direction perpendicular to the base substrate, the second electrode of the light emitting element of at least one of the second color sub-pixels is overlapped with two data lines.

8. The display substrate according to claim 1, wherein the pixel circuit further comprises a threshold compensation transistor, a first electrode of the threshold compensation transistor is electrically connected with a first electrode of the driving transistor, and a second electrode of the threshold compensation transistor is electrically connected with a gate electrode of the driving transistor, the threshold compensation transistor comprises a first gate electrode and a second gate electrode, the second electrode of the light emitting element of the first pixel block shields one of the first gate and the second gate.

9. The display substrate according to claim 8, wherein the plurality of sub-pixels of other colors comprises second color sub-pixels and third color sub-pixels, the second electrode of the light emitting element of each of the third color sub-pixels comprises a main body electrode and a connecting electrode, the connecting electrode is configured to electrically connected with the pixel circuit, in a direction perpendicular to the base substrate, an effective light emitting region of the third color sub-pixel is overlapped with the main body electrode, and the main body electrode of the third color sub-pixel is overlapped with at least one of the first gate and the second gate.

10. The display substrate according to claim 8, wherein the second electrode of the light emitting element of a sub-pixel of at least one color comprises a main body electrode and a connecting electrode, the connecting electrode is configured to electrically connected with the pixel circuit, in the direction perpendicular to the base substrate, an effective light emitting region of the sub-pixel of at least one color is overlapped with the main body electrode;
the second electrode of the light emitting element of the sub-pixel of at least one color further comprises an auxiliary electrode, the auxiliary electrode covers a part of an active layer between orthographic projections of the first gate electrode and the second gate electrode on the active layer.

11. The display substrate according to claim 1, wherein the pixel circuit further comprises a threshold compensation transistor, a first light emitting control transistor, a first connecting portion and a second connecting portion which are between the second electrode of the light emitting element and the base substrate, a first electrode of the threshold compensation transistor is electrically connected with a first electrode of the driving transistor, and a second electrode of the threshold compensation transistor is electrically connected with a gate electrode of the driving transistor through the first connecting portion, a first electrode of the first light emitting control transistor is electrically connected with the first electrode of the driving transistor, and a second electrode of the first light emitting control transistor is electrically connected with the second electrode of the light emitting element through the second connecting portion,
pixel circuits of the plurality of sub-pixels comprise pixel circuit rows arranged in a column direction, each pixel circuit row comprises pixel circuits arranged in a row direction, two adjacent second connecting portions in a same pixel circuit row have different shapes and sizes.

12. The display substrate according to claim 11, further comprising:
a light emitting control signal line, extending in the row direction and arranged in the same layer as the gate electrode of the driving transistor,
wherein, in a direction perpendicular to the base substrate, the second connecting portion is overlapped with the light emitting control signal line and is not overlapped with the gate electrode of the driving transistor.

13. The display substrate according to claim 1, wherein, in the first color sub-pixel pair, the second electrode of the light emitting element of each sub-pixel comprises a main body electrode and a connecting electrode, the connecting electrode is configured to electrically connected with the pixel circuit, in a direction perpendicular to the base substrate, an effective light emitting region of the first pixel block is overlapped with the main body electrode, and an effective light emitting region of the second pixel block is overlapped with the main body electrode;
a part of the second electrode of the light emitting element of the first pixel block except the main body electrode and a part of the second electrode of the light emitting element of the second pixel block except the main body electrode have different shapes and sizes.

14. The display substrate according to claim 13, wherein parts, of second electrodes of the light emitting elements of the first pixel block and the second pixel block, except main body electrodes and connecting electrodes are different in shape and size.

15. A display device, comprising the display substrate according to claim 1.

16. A display substrate, comprising:
a base substrate;
a plurality of sub-pixels on the base substrate, wherein each of the plurality of sub-pixels comprises a light emitting element and a pixel circuit, the light emitting element comprises a first electrode, a light emitting layer and a second electrode which are stacked in sequence, the second electrode is between the light emitting layer and the base substrate, the pixel circuit comprises a first connecting portion, a driving transistor and a threshold compensation transistor which are between the second electrode and the base substrate, the first connecting portion extends in a first direction, a first electrode of the threshold compensation transistor is electrically connected with a first electrode of the driving transistor, and a second electrode of the threshold compensation transistor is electrically connected with a gate electrode of the driving transistor through the first connecting portion,
the plurality of sub-pixels comprises at least one first color sub-pixel pair and a plurality of sub-pixels of other colors, each first color sub-pixel pair comprises a first pixel block and a second pixel block arranged in a second direction, a minimum distance between the first pixel block and the second pixel block in each first color sub-pixel pair is not greater than a minimum distance between two sub-pixels of a same color in the plurality of sub-pixels of other colors, and an included angle between the second direction and the first direction is in a range from 80 degrees to 100 degrees; and
in the first pixel block, an overlapping area between an orthographic projection of the second electrode of the light emitting element on the base substrate and an orthographic projection of the first connecting portion on the base substrate is a first overlapping area; in the second pixel block, an overlapping area between an orthographic projection of the second electrode of the light emitting element on the base substrate and an orthographic projection of the first connecting portion on the base substrate is a second overlapping area; and a ratio of the first overlapping area to the second overlapping area is in a range from 0.8 to 1.2;
in a same first color sub-pixel pair, an overlapping situation, of orthographic projections of the second electrode of the light emitting element of one first pixel block and the gate electrode of the driving transistor of the one first pixel block on the base substrate, is the same as an overlapping situation, of orthographic projections of the second electrode of the light emitting element of one second pixel block and the gate electrode of the driving transistor of the one second pixel block on the base substrate.

17. The display substrate according to claim 16, wherein, in the first pixel block, the second electrode of the light emitting element covers 60%-90% of an area of the first connecting portion; and in the second pixel block, the second electrode of the light emitting element covers 60%-90% of an area of the first connecting portion.

18. The display substrate according to claim 16, wherein the first pixel block comprises a first effective light emitting region, and the second pixel block comprises a second effective light emitting region; in the first pixel block, a minimum distance between an orthographic projection of the first connecting portion on a straight line extending in the second direction and an orthographic projection of the first effective light emitting region on the straight line is a first distance, or the orthographic projection of the first connecting portion on the straight line extending in the second direction is overlapped with the orthographic projection of the first effective light emitting region on the straight line; in the second pixel block, a minimum distance between an orthographic projection of the first connecting portion on the straight line and an orthographic projection of the second effective light emitting region on the straight line is a second distance, and the first distance is less than the second distance;

in the first pixel block, a gate electrode of the threshold compensation transistor is located at a side of the first connecting portion away from the first effective light emitting region; and in the second pixel block, a gate electrode of the threshold compensation transistor is located at a side of the first connecting portion close to the second effective light emitting region.

19. The display substrate according to claim 18, wherein the second electrode of the light emitting element of each of the plurality of sub-pixels comprises a main body electrode and a connecting electrode; in the first pixel block, a shape of the main body electrode is approximately the same as a shape of the first effective light emitting region, and an orthographic projection of the first effective light emitting region on the base substrate is within an orthographic projection of the main body electrode on the base substrate, and the first effective light emitting region is overlapped with the first connecting portion;

in the second pixel block, a shape of the main body electrode is approximately the same as a shape of the second effective light emitting region, an orthographic projection of the second effective light emitting region on the base substrate is within an orthographic projection of the main body electrode on the base substrate, and the second effective light emitting region is not overlapped with the first connecting portion.

20. The display substrate according to claim 19, wherein, in the first color sub-pixel pair, the second electrode of the light emitting element further comprises an auxiliary electrode connecting the main body electrode with the connecting electrode, and the connecting electrode extends in the first direction, in the first pixel block, the auxiliary electrode is located at a side of the main body electrode away from the second effective light emitting region, and in the second pixel block, the auxiliary electrode is located at a side of the main body electrode away from the first effective light emitting region.

* * * * *